(12) United States Patent
Higuchi et al.

(10) Patent No.: US 7,601,387 B2
(45) Date of Patent: *Oct. 13, 2009

(54) PIEZOELECTRIC FILM LAMINATE AND METHOD OF MANUFACTURING THE SAME

(75) Inventors: Takamitsu Higuchi, Matsumoto (JP);
Takeshi Kijima, Matsumoto (JP);
Mayumi Ueno, Chino (JP)

(73) Assignee: Seiko Epson Corporation (JP)

( * ) Notice: Subject to any disclaimer, the term of this patent is extended or adjusted under 35 U.S.C. 154(b) by 477 days.

This patent is subject to a terminal disclaimer.

(21) Appl. No.: 11/389,985

(22) Filed: Mar. 27, 2006

(65) Prior Publication Data

US 2006/0222895 A1 Oct. 5, 2006

(30) Foreign Application Priority Data

Mar. 29, 2005 (JP) .............................. 2005-095554

(51) Int. Cl.
*B05D 5/12* (2006.01)
*H01L 41/22* (2006.01)

(52) U.S. Cl. ..................................... 427/100; 29/25.35

(58) Field of Classification Search ................. 427/100; 29/25.35
See application file for complete search history.

(56) References Cited

U.S. PATENT DOCUMENTS 6,198,197 B1 * 3/2001 Yamanouchi et al. ... 310/313 R
7,265,482 B2 * 9/2007 Higuchi et al. .............. 310/360
7,345,408 B2 * 3/2008 Higuchi et al. .............. 310/360
2004/0000840 A1   1/2004 Higuchi
2004/0189425 A1   9/2004 Iwashita et al.
2004/0197599 A1  10/2004 Higuchi et al.
2004/0214352 A1 * 10/2004 Kijima et al. .................. 438/3
2004/0237882 A1  12/2004 Higuchi et al.
2005/0200235 A1   9/2005 Higuchi
2006/0216549 A1 * 9/2006 Kijima et al. ............... 428/701

FOREIGN PATENT DOCUMENTS

| EP | 1 515 436 | 8/2004 |
|---|---|---|
| JP | 10-065488 | 3/1998 |
| JP | 2004-224627 | 8/2004 |
| JP | 2004-235874 | 8/2004 |
| JP | 2004-292226 | 10/2004 |
| JP | 2004-292228 | 10/2004 |

OTHER PUBLICATIONS

Hiroyuki Odagawa, et al., "Superhigh Electromechanical Coupling and Zero-Temperature Characteristics of $KNbO_3$ and Wide Band Filter Applications", Jpn. J. Appl. Phys., vol. 37, pp. 2929-2932 (1998).

(Continued)

*Primary Examiner*—Brian K Talbot
(74) *Attorney, Agent, or Firm*—Harness, Dickey & Pierce, P.L.C.

(57) ABSTRACT

A piezoelectric film laminate including a sapphire substrate and a lead zirconate titanate niobate film and a potassium niobate film formed on the sapphire substrate.

8 Claims, 15 Drawing Sheets

OTHER PUBLICATIONS

Jun Koike, et al., "1.5 GHz Low-Loss Surface Acoustic Wave Filter Using ZnO/Sapphire Substrate", Jpn. J. Appl. Phys., vol. 32, pp. 2337-2340 (1993).

Yoshihiko Shibata, et al., "Epitaxial Growth of $LiNbO_3$ Films on Sapphire Substrates by Excimer Laser Ablation Method and Their Surface Acoustic Wave Properties", Jpn. J. Appl. Phys., vol. 32, pp. L745-L747 (1993).

Hiromu Miyazawa, et al., "Electronic States of Perovskite-Type Oxides and Ferroelectricity", Jpn. J. Appl. Phys., vol. 39, pp. 5679-5682 (2000).

K. Yamanouchi, et al., "Theoretical and experimental study of super-high electromechanical coupling surface acoustic wave propagation in $KNbO_3$ single crystal", Electronics Letters, vol. 33, No. 3, 1 page (1997).

Communication from European Patent Office regarding counterpart application.

* cited by examiner

DIMETHYL SUCCINATE

DIETHYL SUCCINATE

LINEAR SATURATED POLYCARBOXYLIC ACID

DIBUTYL OXALATE

DIMETHYL MALONATE

DIMETHYL ADIPATE

TRIBUTYL CITRATE

TRIETHYL 1,1,2-ETHANETRICARBOXYLATE

TETRAETHYL 1,1,2,2-ETHANETETRACARBOXYLATE

LINEAR UNSATURATED POLYCARBOXYLIC ACID

DIMETHYL MALEATE

DIETHYL FUMARATE

TRANS-ACONITIC ACID

CYCLIC POLYCARBOXYLIC ACID

TRIMESIC ACID

PYROMELLITIC ACID

TRIMETHYL 1,2,4-BENZENETRICARBOXYLATE 1,2,3,4-CYCLOPENTANETETRACARBOXYLIC ACID

SAPPHIRE(0006)

PZTN(200)
KZbO$_3$(200)$_{PC}$

PIEZOELECTRIC FILM LAMINATE AND METHOD OF MANUFACTURING THE SAME

Japanese Patent Application No. 2005-95554, filed on Mar. 29, 2005, is hereby incorporated by reference in its entirety.

BACKGROUND OF THE INVENTION

The present invention relates to a piezoelectric film laminate and a method of manufacturing the same.

A demand for a surface acoustic wave device has rapidly increased along with a remarkable development in the communication field represented by mobile communication utilizing a portable telephone or the like. The development of the surface acoustic wave device is trending toward a reduction in size and an increase in efficiency and frequency. This requires a higher electromechanical coupling factor (coefficient) ($k^2$), more stable temperature properties, and a higher surface acoustic wave propagation velocity. When using a surface acoustic wave device as a high frequency filter, a high electromechanical coupling factor is desired in order to obtain a passband with a small loss and a wide bandwidth. In order to increase the resonance frequency, a material exhibiting a higher speed of sound is desired from the viewpoint of limitations to the design rule for the pitch of interdigital transducers. In order to obtain stable properties at an operating temperature, the temperature coefficient of frequency (TCF) must be small.

A surface acoustic wave device having a structure in which interdigital transducers are formed on a piezoelectric single crystal has been mainly used. As typical examples of the piezoelectric single crystal, a rock crystal, lithium niobate ($LiNbO_3$), lithium tantalate ($LiTaO_3$), and the like can be given. For example, $LiNbO_3$ having a high electromechanical coupling factor is used for an RF filter for which an increase in band and a decrease in loss in the passband are required. A rock crystal having a small temperature coefficient of frequency is used for an IF filter for which stable temperature properties are required in a narrow band. $LiTaO_3$ having an intermediate electromechanical coupling factor and temperature coefficient of frequency between those of $LiNbO_3$ and a rock crystal plays an intermediate role between $LiNbO_3$ and a rock crystal. However, the electromechanical coupling factor of $LiNbO_3$ is only about 20%.

In recent years, a cut angle of a potassium niobate ($KNbO_3$) (a=0.5695 nm, b=0.5721 nm, c=0.3973 nm; this index indication is hereinafter used for an orthorhombic crystal) single crystal showing a high electromechanical coupling factor has been found. As described in Eletron. Lett. Vol. 33 (1997) 193., it was calculated that a 0°Y-cut X-propagation ("0°Y-X") $KNbO_3$ single crystal plate shows an electromechanical coupling factor as high as 53%. As described in Jpn. J. Appl. Phys. Vol. 37 (1998) 2929., it was confirmed by experiments that a 0° Y-X $KNbO_3$ single crystal plate shows an electromechanical coupling factor as high as 50%, and the oscillation frequency of a filter using a 45° to 75° rotated Y-X $KNbO_3$ single crystal substrate shows zero temperature properties at or near room temperature. JP-A-10-65488 discloses rotated Y-X $KNbO_3$ single crystal plates including a 0° Y-X $KNbO_3$ single crystal plate.

In a surface acoustic wave device using a piezoelectric single crystal substrate, properties such as the electromechanical coupling factor, temperature coefficient, and speed of sound are values specific to the material and are determined by the cut angle and the propagation direction. A 0° Y-X $KNbO_3$ single crystal substrate has a high electromechanical coupling factor, but does not show zero temperature properties at or near room temperature, differing from a 45° to 75° rotated Y-X $KNbO_3$ single crystal substrate. A 0° Y-X $KNbO_3$ single crystal substrate shows a propagation velocity lower than that of $SrTiO_3$ or $CaTiO_3$ which is also a perovskite type oxide. As described above, a high speed of sound, a high electromechanical coupling factor, and zero temperature properties cannot be obtained by merely using a $KNbO_3$ single crystal substrate.

The speed of sound, electromechanical coupling factor, and temperature properties are expected to be increased by depositing a piezoelectric thin film on a substrate and controlling the thickness of the piezoelectric thin film. Jpn. J. Appl. Phys. Vol. 32 (1993) 2337. discloses a zinc oxide (ZnO) thin film formed on a sapphire substrate, and Jpn. J. Appl. Phys. Vol. 32 (1993) L745. discloses a $LiNbO_3$ thin film formed on a sapphire substrate, for example. Therefore, the above-mentioned properties are expected to be improved by forming a $KNbO_3$ thin film on a substrate.

It is desirable that the piezoelectric thin film be oriented in an optimum direction so that the electromechanical coupling factor and the temperature properties are improved. In order to reduce a loss caused by leaky wave propagation, it is desirable that the piezoelectric thin film be a flat and dense epitaxial film. Y-X $KNbO_3$ having an electromechanical coupling factor of 50% corresponds to a pseudocubic (100) crystal, and 90°Y-X $KNbO_3$ having an electromechanical coupling factor of 10% corresponds to a pseudocubic (110) crystal. Therefore, a Y-X $KNbO_3$ thin film having an electromechanical coupling factor of 50% or a 90°Y-X $KNbO_3$ thin film having an electromechanical coupling factor of 10% is expected to be obtained by using an $SrTiO_3$ (100) or (110) single crystal substrate.

However, a single phase potassium niobate thin film and a Y-X epitaxial potassium niobate thin film have not yet been formed on a large insulator substrate.

SUMMARY

According to a first aspect of the invention, there is provided a piezoelectric film laminate, comprising a lead zirconate titanate niobate film and a potassium niobate film stacked on the lead zirconate titanate niobate film.

According to a second aspect of the invention, there is provided a method of manufacturing a piezoelectric film laminate, comprising:

providing a sapphire substrate; providing a precursor composition including a precursor for forming a lead zirconate titanate niobate film, the precursor including at least niobium, titanium, and zirconium and having a partial ester bond;

applying the precursor composition to the sapphire substrate and heating the applied precursor composition to form a lead zirconate titanate niobate film; and forming a potassium niobate film on the lead zirconate titanate niobate film.

DETAILED DESCRIPTION OF THE EMBODIMENT

Figure 1A:
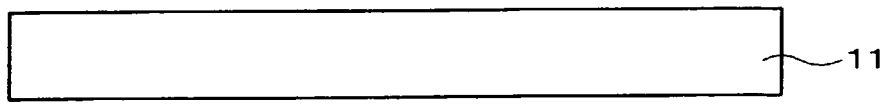
FIGS. 1A to 1C are cross-sectional views schematically showing a piezoelectric film laminate according to the first embodiment of the invention.

The invention may provide a piezoelectric film laminate in which a lead zirconate titanate niobate film and a potassium niobate film are stacked, and a method of manufacturing the same.

According to one embodiment of the invention, there is provided a piezoelectric film laminate, comprising a lead zirconate titanate niobate film and a potassium niobate film stacked on the lead zirconate titanate niobate film.

In this piezoelectric film laminate, the lead zirconate titanate niobate film may be epitaxially grown in a tetragonal (110) or (101) orientation or a rhombohedral (110) orientation; and the potassium niobate film may be epitaxially grown in an orthorhombic (111), (100), or (001) orientation when orthorhombic indices are defined as $2^{1/2}b<a<c$.

In this piezoelectric film laminate, the lead zirconate titanate niobate film and the potassium niobate film may have twofold inplane symmetry.

In this piezoelectric film laminate, the lead zirconate titanate niobate film may include niobium in an amount of 5 to 30 mol % of a total amount of niobium, titanium, and zirconium.

In this piezoelectric film laminate, the lead zirconate titanate niobate film may include silicon or silicon and germanium in an amount of 0.5 mol % or more.

The piezoelectric film laminate may further comprise another lead zirconate titanate niobate film on the potassium niobate film.

The piezoelectric film laminate may comprise a sapphire substrate on which the lead zirconate titanate niobate film and the potassium niobate film are formed in that order.

In this piezoelectric film laminate, the sapphire substrate may have R plane (1-102) orientation.

In this piezoelectric film laminate, a [001] axis may be parallel to a [11-20] direction of an R plane of the sapphire substrate when the lead zirconate titanate niobate film is grown in a tetragonal (110) orientation;

a [010] axis may be parallel to the [11-20] direction of the R plane of the sapphire substrate when the lead zirconate titanate niobate film is grown in a tetragonal (101) orientation; and a [001] axis may be parallel to the [11-20] direction of the R plane of the sapphire substrate when the lead zirconate titanate niobate film is grown in a rhombohedral (110) orientation.

In this piezoelectric film laminate, a [10-1] axis may be parallel to the [11-20] direction of the R plane of the sapphire substrate when the potassium niobate film is grown in an orthorhombic (111) orientation; and a [010] axis may be parallel to the [11-20] direction of the R plane of the sapphire substrate when the potassium niobate film is grown in an orthorhombic (100) or (001) orientation.

The piezoelectric film laminate may comprise a potassium niobate solid solution film instead of the potassium niobate film.

According to one embodiment of the invention, there is provided a method of manufacturing a piezoelectric film laminate, comprising:

providing a sapphire substrate;

providing a precursor composition including a precursor for forming a lead zirconate titanate niobate film, the precursor including at least niobium, titanium, and zirconium and having a partial ester bond;

applying the precursor composition to the sapphire substrate and heating the applied precursor composition to form a lead zirconate titanate niobate film; and forming a potassium niobate film on the lead zirconate titanate niobate film.

In this method of manufacturing a piezoelectric film laminate, the precursor may further include lead.

In this method of manufacturing a piezoelectric film laminate, the precursor may be dissolved or dispersed in an organic solvent.

In this method of manufacturing a piezoelectric film laminate, the organic solvent may be an alcohol.

In this method of manufacturing a piezoelectric film laminate, the precursor composition may be obtained by mixing a sol-gel raw material including a hydrolysis-condensation product of a metal alkoxide of at least niobium, titanium, and zirconium, a polycarboxylic acid or a polycarboxylic acid ester, and an organic solvent; and the precursor composition may include the precursor having an ester bond resulting from esterification of the polycarboxylic acid or a polycarboxylic acid derived from the polycarboxylic acid ester and the metal alkoxide.

In this method of manufacturing a piezoelectric film laminate, the polycarboxylic acid or the polycarboxylic acid ester may be a dicarboxylic acid or a dicarboxylic acid ester.

In this method of manufacturing a piezoelectric film laminate, the dicarboxylic acid ester may be at least one ester selected from a succinic acid ester, a maleic acid ester, and a malonic acid ester.

In this method of manufacturing a piezoelectric film laminate, the sol-gel raw material may further include a metal carboxylate.

In this method of manufacturing a piezoelectric film laminate, the metal carboxylate may be a lead carboxylate.

These embodiments of the invention will be described below, with reference to the drawings.

1. First Embodiment 1.1 Piezoelectric Film Laminate

Figure 1B:
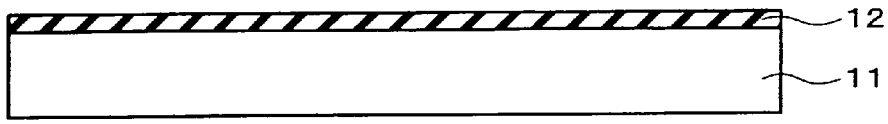
Figure 1C:
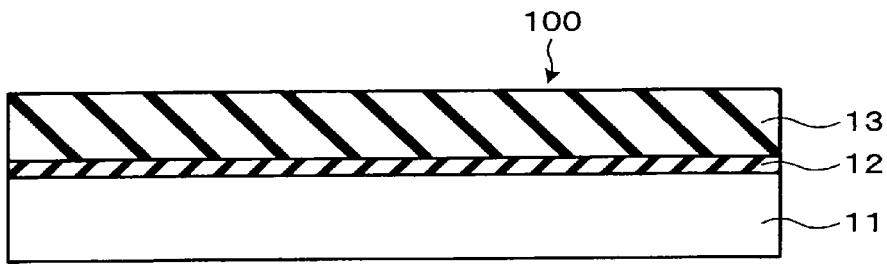

FIG. 1C is a cross-sectional view schematically showing a piezoelectric film laminate 100 according to a first embodiment.

As shown in FIG. 1C, the piezoelectric film laminate 100 according to the first embodiment may include a substrate 11 and a piezoelectric film laminate formed on the substrate 11 and including a lead zirconate titanate niobate film 12 and a potassium niobate film 13.

As the substrate 11, an R-plane sapphire substrate may be used. It is preferable to use the R-plane sapphire substrate because the R-plane sapphire substrate allows the lead zirconate titanate niobate film 12 to be epitaxially grown, is inexpensively available as a large substrate, and can be repeatedly used due to etchant resistance.

The lead zirconate titanate niobate (Pb(Zn,Ti,Nb)O$_3$) (hereinafter may be called "PZTN") film 12 is epitaxially grown in a tetragonal (110) or (101) orientation or a rhombohedral (110) orientation, as is clear from examples described later. The lead zirconate titanate niobate film 12 has twofold inplane symmetry. Specifically, since the lead zirconate titanate niobate film 12 has a single crystal structure differing from those of known films and has twofold symmetry, the lead zirconate titanate niobate film 12 has a single domain structure (structure without different domains) by a polarization treatment or the like or spontaneously.

The [001] axis when the lead zirconate titanate niobate film 12 is grown in the tetragonal (110) orientation, the [010] axis when the lead zirconate titanate niobate film 12 is grown in the tetragonal (101) orientation, or the [001] axis when the lead zirconate titanate niobate film 12 is grown in the rhombohedral (110) orientation is parallel to the [11-20] direction of the R plane of the sapphire substrate.

The potassium niobate (KNbO$_3$) film 13 is epitaxially grown in an orthorhombic (111), (100), or (001) orientation when the orthorhombic indices are defined as "2$^{1/2}$b<a<c", as is clear from examples described later. The potassium niobate film 13 has twofold inplane symmetry. Specifically, since the potassium niobate film 13 has a single crystal structure and has twofold symmetry, the potassium niobate film 13 has a single domain structure by a polarization treatment or the like or spontaneously.

The [10-1] axis when the potassium niobate film 13 is grown in the orthorhombic (111) orientation or the [010] axis when the potassium niobate film 13 is grown in the orthorhombic (100) or (001) orientation is parallel to the [11-20] direction of the R plane of the sapphire substrate.

According to the first embodiment, it is considered that the lead zirconate titanate niobate film 12 functions as a buffer layer exhibiting orientation controllability, whereby the potassium niobate film 13 epitaxially grown on the lead zirconate titanate niobate film 12 has the above-described crystal properties.

The lead zirconate titanate niobate film 12 may include niobium in an amount of preferably 5 mol % or more, and still more preferably 10 to 30 mol % of the total amount of niobium, titanium, and zirconium. The lead zirconate titanate niobate film according to the first embodiment may include silicon or silicon and germanium in an amount of preferably 0.5 mol % or more, and still more preferably 0.5 to 5 mol %.

The features of the lead zirconate titanate niobate film 12 due to inclusion of niobium are described below.

Niobium has a size almost equal to the size of titanium (i.e. niobium and titanium have ionic radii close to each other and have the same atomic radius), and has an atomic weight twice the atomic weight of titanium. Therefore, niobium is not easily released from the lattice even if a collision occurs between atoms due to lattice vibration. Niobium is stable at a valence of +5. Therefore, even if lead is released from the lattice, the valence of lead can be compensated for by Nb$^{5+}$. Moreover, even if lead is released from the lattice during crystallization, it is easier for niobium having a small size to enter the lattice than for oxygen having a large size to be released.

Since Nb$^{4+}$ also exists, niobium can replace Ti$^{4+}$. Moreover, since niobium has very strong covalent bonding properties, lead is not easily released (H. Miyazawa, E. Natori, S. Miyashita; Jpn. J. Appl. Phys. 39 (2000) 5679).

Since the lead zirconate titanate niobate (PZTN) film 12 includes the above-mentioned amount of niobium, the lead zirconate titanate niobate film 12 exhibits excellent composition controllability due to the absence of an adverse effect caused by lead deficiency. As a result, PZTN exhibits an excellent electromechanical coupling factor, piezoelectricity, insulating properties, and the like in comparison with known Pb(Zr,Ti)O$_3$ (PZT).

Niobium has been doped into PZT mainly in the Zr-rich rhombohedral region. However, the amount of doping is as small as about 0.2 to 0.025 mol % (J. Am. Ceram. Soc, 84 (2001) 902; Phys. Rev. Let, 83 (1999) 1347). This is because the crystallization temperature is increased by adding a large amount of niobium (e.g. 800° C. or more when adding niobium in an amount of 10 mol %).

It is preferable to add silicon to the PZTN film in an amount of 0.5 to 5 mol %, for example. This reduces the crystallization energy of PZTN. Specifically, the crystallization temperature of PZTN can be reduced by adding silicon in addition to niobium. Silicon and germanium may also be used instead of silicon.

The thickness of the lead zirconate titanate niobate film 12 is not particularly limited insofar as the potassium niobate film 13 can be epitaxially grown. The thickness of the lead zirconate titanate niobate film 12 may be 10 to 100 nm, for example. The thickness of the potassium niobate film 13 is not particularly limited, and is selected depending on the device to which the piezoelectric film laminate 100 is applied. The thickness of the potassium niobate film 13 may be 100 nm to 100 μm, for example.

As described above, since the lead zirconate titanate niobate film 12 and the potassium niobate film 13 forming the piezoelectric film laminate according to the first embodiment are epitaxially grown single crystals and have a single domain structure by a polarization treatment or the like or spontaneously, a domain boundary does not exist. Therefore, the lead zirconate titanate niobate film 12 and the potassium niobate film 13 show a small energy loss at the crystal grain boundaries and a small surface acoustic wave propagation loss and therefore have a high electromechanical coupling factor.

When applying the piezoelectric film laminate according to the first embodiment to a surface acoustic wave device, the potassium niobate film 13 mainly determines the properties of the surface acoustic wave device. Therefore, since the potassium niobate film 13 has the above-described features, an excellent surface acoustic wave device can be obtained which has a high electromechanical coupling factor, can increase the passband when used as a frequency filter, and can be reduced in size when used as an oscillator due to a reduction in the number of IDT pairs.

1.2 Method of Manufacturing Piezoelectric Film Laminate

A method of manufacturing the piezoelectric film laminate 100 according to the first embodiment is described below with reference to FIGS. 1A to 1C.

(1) As shown in FIG. 1A, the substrate (hereinafter may be called "R-plane sapphire substrate") 11 made of an R-plane sapphire substrate is provided. The R-plane sapphire substrate 11 has been cleaned by washing in advance. The washing may be performed by immersing the R-plane sapphire substrate 11 in an organic solvent and washing the R-plane sapphire substrate 11 using an ultrasonic washing machine. The organic solvent used is not particularly limited. For example, a mixed solution of ethyl alcohol and acetone may be used.

(2) As shown in FIG. 1B, a precursor composition is applied to the R-plane sapphire substrate 11 and heated to form the lead zirconate titanate niobate film 12. The coating method for the precursor composition is not particularly limited. A known coating method such as a spin coating method or a dipping method may be used. The heat treatment includes at least a heat treatment for crystallizing the precursor composition. The heat treatment is not particularly limited. A known method such as a rapid thermal annealing (RTA) method may be used.

The precursor composition includes a precursor for forming lead zirconate titanate niobate. The precursor includes at least niobium, titanium, and zirconium, and includes a partial ester bond. The precursor is dissolved or dispersed in an organic solvent. As the organic solvent, an alcohol may be used. The alcohol is not particularly limited. As examples of the alcohol, monohydric alcohols such as butanol, methanol, ethanol, and propanol, and polyhydric alcohols can be given. Specific examples of the alcohol are given below.

Monohydric Alcohol:

Propanol (propyl alcohol): 1-propanol (boiling point: 97.4° C.) and 2-propanol (boiling point: 82.7° C.)

Butanol (butyl alcohol): 1-butanol (boiling point: 117° C.), 2-butanol (boiling point: 100° C.), 2-methyl-1-propanol (boiling point: 108° C.), and 2-methyl-2-propanol (melting point: 25.4° C., boiling point: 83° C.)

Pentanol (amyl alcohol): 1-pentanol (boiling point: 137° C.), 3-methyl-1-butanol (boiling point: 131° C.), 2-methyl-1-butanol (boiling point: 128° C.), 2,2-dimethyl-1-propanol (boiling point: 113° C.), 2-pentanol (boiling point: 119° C.), 3-methyl-2-butanol (boiling point: 112.5° C.), 3-pentanol (boiling point: 117° C.), and 2-methyl-2-butanol (boiling point: 102° C.)

Polyhydric Alcohol:

Ethylene glycol (melting point: −11.5° C., boiling point: 197.5° C.) and glycerol (melting point: 17° C., boiling point: 290° C.)

In the precursor composition used in the first embodiment, since the precursor includes an ester bond resulting from esterification of a polycarboxylic acid and a metal alkoxide so that a reversible reaction can occur, the polymerized precursor can be decomposed into the metal alkoxide, as described later in detail. Therefore, the resulting metal alkoxide can be recycled as the precursor raw material.

The precursor composition used in the first embodiment has the following advantages. A commercially available PZT sol-gel solution generally contains lead acetate as the lead raw material. However, since lead acetate bonds to an alkoxide of Ti or Zr to only a small extent, lead is not easily incorporated into the precursor network. According to the first embodiment, since lead can be easily incorporated into the precursor network as described later in detail, the precursor composition can include a lead-containing network (precursor). Therefore, the precursor composition used in the first embodiment exhibits excellent composition controllability in comparison with a known sol-gel raw material, whereby lead can be prevented from being released from PZTN.

This feature is described below taking succinic acid, which is a dicarboxylic acid, as an example. A first carboxyl group, which is one of the two carboxyl groups of succinic acid and initially functions as an acid, has a pH of 4.0, which is lower than that of acetic acid (pH=4.56) (i.e. stronger than acetic acid). Therefore, lead acetate bonds to succinic acid. Specifically, a reaction indicated by "salt of weak acid+strong acid?salt of strong acid+weak acid" occurs. Moreover, since the remaining second carboxyl group of succinic acid bonds to another MOD molecule or alkoxide, lead can be easily incorporated into the precursor network.

The precursor composition used in the first embodiment is obtained as follows.

The precursor composition is obtained by mixing a sol-gel raw material containing a hydrolysis-condensation product of a metal alkoxide, a polycarboxylic acid or a polycarboxylic acid ester, and an organic solvent. The sol-gel raw material includes at least niobium, titanium, and zirconium. The resulting precursor composition includes a precursor including an ester bond resulting from esterification of the polycarboxylic acid or a polycarboxylic acid derived from the polycarboxylic acid ester and the metal alkoxide.

Figure 4:
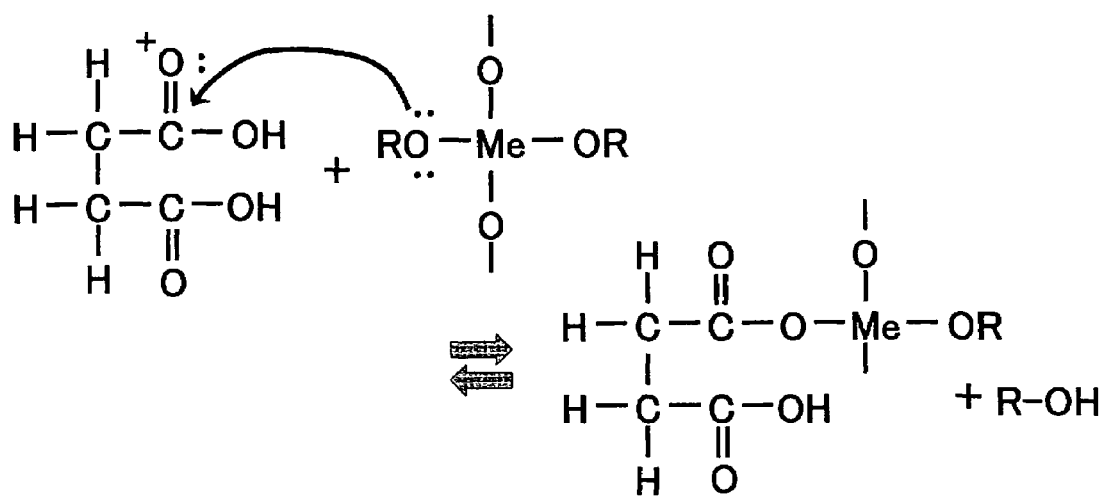
FIG. 4 shows a precursor formation reaction in a precursor composition used in the first embodiment.
Figure 5:
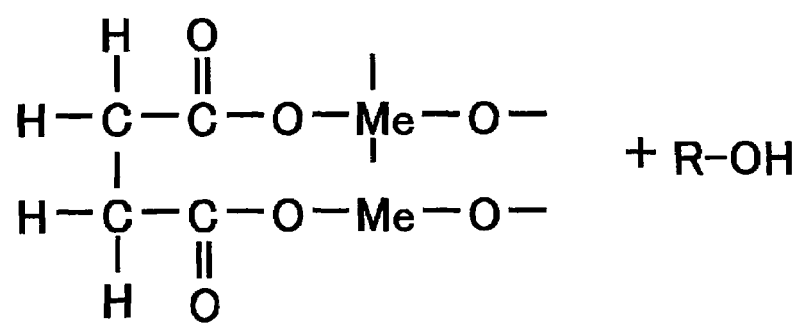
FIG. 5 shows a precursor formation reaction in the precursor composition used in the first embodiment.

FIGS. 4 and 5 schematically illustrate the precursor formation reaction in the manufacturing method according to the first embodiment.

The precursor formation reaction is roughly divided into a first-stage alkoxyl group substitution reaction shown in FIG. 4, and a second-stage polymer network formation reaction by esterification shown in FIG. 5. FIGS. 4 and 5 illustrate an example of using dimethyl succinate as the polycarboxylic acid ester and n-butanol as the organic solvent. Although dimethyl succinate is nonpolar, dimethyl succinate dissociates in an alcohol to produce a dicarboxylic acid.

In the first-stage reaction, dimethyl succinate and the metal alkoxide of the sol-gel raw material undergo esterification and are bonded through an ester bond, as shown in FIG. 4. Specifically, dimethyl succinate dissociates in n-butanol so that one of the carbonyl groups (first carbonyl group) is protonated. A substitution reaction occurs between the first carbonyl group and the alkoxyl group of the metal alkoxide to produce a reaction product, in which the first carboxyl group is esterified, together with an alcohol. The term "ester bond" used herein means a bond (—COO—) formed by a carbonyl group and an oxygen atom.

In the second-stage reaction, a substitution reaction occurs between the carboxyl group (second carboxyl group) remaining unreacted in the first-stage reaction and the alkoxyl group of the metal alkoxide to produce a reaction product, in which the second carboxyl group is esterified, together with an alcohol.

A polymer network, in which the hydrolysis-condensation products of the metal alkoxide included in the sol-gel raw material are bonded through ester bonds, is obtained by the above two-stage reaction. Therefore, the polymer network includes a moderate amount of ester bond in the network. Since dimethyl succinate dissociates in two stages and the first carboxyl group has an acid dissociation constant greater than that of the second carboxyl group, the first-stage reaction has a rate of reaction higher than the rate of reaction of the second-stage reaction. Therefore, the second-stage reaction proceeds more slowly than the first-stage reaction.

In the first embodiment, the following method may be used to promote the above-described esterification reaction.

(a) The concentration or reactivity of the reaction product may be increased. In more detail, the reactivity is increased by increasing the degree of dissociation of the polycarboxylic acid or the polycarboxylic acid ester by increasing the temperature of the reaction system. It is preferable that the temperature of the reaction system be higher than room temperature and lower than the boiling point of the organic solvent, although the temperature of the reaction system varies depending on the boiling point of the organic solvent. The temperature of the reaction system may be 100° C. or less, and preferably 50 to 100° C., for example.

(b) A reaction by-product may be removed. In more detail, esterification is promoted by removing water and an alcohol produced during esterification.

(c) The molecular motion of the reaction product may be physically accelerated. In more detail, the reactivity of the reaction product is increased by applying energy rays such as ultraviolet rays.

The organic solvent used in the method of producing the precursor composition may be the above-mentioned alcohol. The sol-gel raw material and the polycarboxylic acid or the polycarboxylic acid ester can be efficiently dissolved by using an alcohol as the solvent.

The amount of polycarboxylic acid or polycarboxylic acid ester used is adjusted depending on the composition ratio of the sol-gel raw material and PZTN. The ratio of the total molar ion concentration of the PZT sol-gel raw material, PbNb sol-gel raw material, and PbSi sol-gel raw material, to which the polycarboxylic acid is bonded, to the molar ion concentration of the polycarboxylic acid is set at preferably "1≦(molar ion concentration of polycarboxylic acid)/(total molar ion concentration of raw material solution)", and still more preferably 1:1. The polycarboxylic acid may be added in an amount of 0.35 mol, for example.

Specifically, it is preferable that the amount of polycarboxylic acid or polycarboxylic acid ester added be equal to or greater than the total number of moles of the raw material solution. All the raw materials bond when the ratio of the molar ionic concentration is 1:1. Since an ester stably exists in an acidic solution, it is preferable to add excess polycarboxylic acid to the total number of moles of the raw material solution in order to allow an ester to stably exist. The number of moles of the polycarboxylic acid or the polycarboxylic acid ester used herein refers to the molar ionic concentration obtained by dividing the number of moles by the number of carboxyl groups. Specifically, when using a dicarboxylic acid or a dicarboxylic acid ester, one dicarboxylic acid or dicarboxylic acid ester molecule can bond to two raw material molecules. Therefore, the ratio is 1:1 when the amount of dicarboxylic acid or dicarboxylic acid ester is 0.5 mol for one mol of the raw material solution.

The polycarboxylic acid ester does not initially function as an acid. The polycarboxylic acid ester produces a polycarboxylic acid when caused to dissociate in an alcohol. In this case, it is preferable that the alcohol be added so that "1≦ (number of moles of alcohol/number of moles of polycarboxylic acid ester)". This is because the polycarboxylic acid ester more sufficiently and stably dissociates as the number of moles of alcohol is greater. The number of moles of alcohol and the number of moles of polycarboxylic acid ester used herein refer to the molar ion concentration obtained by dividing the number of moles of alcohol by the number of hydroxyl groups and the molar ion concentration obtained by dividing the number of moles of polycarboxylic acid ester by the number of carboxyl groups, respectively.

In the method of producing the precursor composition, the polycarboxylic acid or the polycarboxylic acid ester may be a carboxylic acid or a carboxylic acid ester having two or more carboxyl groups. As examples of the polycarboxylic acid, the following compounds can be given.

As examples of a tricarboxylic acid, trans-aconitic acid, trimesic acid, and the like can be given. As examples of a tetracarboxylic acid, pyromellitic acid, 1,2,3,4-cyclopentanetetracarboxylic acid, and the like can be given. As examples of the polycarboxylic acid ester which dissociates in an alcohol to function as a polycarboxylic acid, dicarboxylic acid esters such as dimethyl succinate, diethyl succinate, dibutyl oxalate, dimethyl malonate, dimethyl adipate, dimethyl maleate, and diethyl fumarate, tricarboxylic acid esters such as tributyl citrate and triethyl 1,1,2-ethanetricarboxylate, tetracarboxylic acid esters such as tetraethyl 1,1,2,2-ethanetetracarboxylate and trimethyl 1,2,4-benzenetricarboxylate, and the like can be given.

The above polycarboxylic acid ester dissociates in the presence of an alcohol to function as a polycarboxylic acid. FIGS. 3A to 3D show examples of the above-mentioned polycarboxylic acids and polycarboxylic acid esters. A feature of the precursor composition used in the first embodiment is that the network is grown by esterification using the polycarboxylic acid. The ester network is not grown when using a monocarboxylic acid or a monocarboxylic acid ester, such as acetic acid or methyl acetate.

In the method of producing the precursor composition, the dicarboxylic acid ester is preferably at least one compound selected from a succinic acid ester, a maleic acid ester, and a malonic acid ester. As specific examples of these esters, dimethyl succinate, dimethyl maleate, and dimethyl malonate can be given.

The polycarboxylic acid ester preferably has a molecular weight of 150 or less. If the molecular weight of the polycarboxylic acid ester is too high, the film may be damaged when the ester volatilizes during heat treatment, whereby a dense film may not be obtained. The polycarboxylic acid ester is preferably liquid at room temperature. If the polycarboxylic acid ester is solid at room temperature, gelation may occur.

Figure 2:
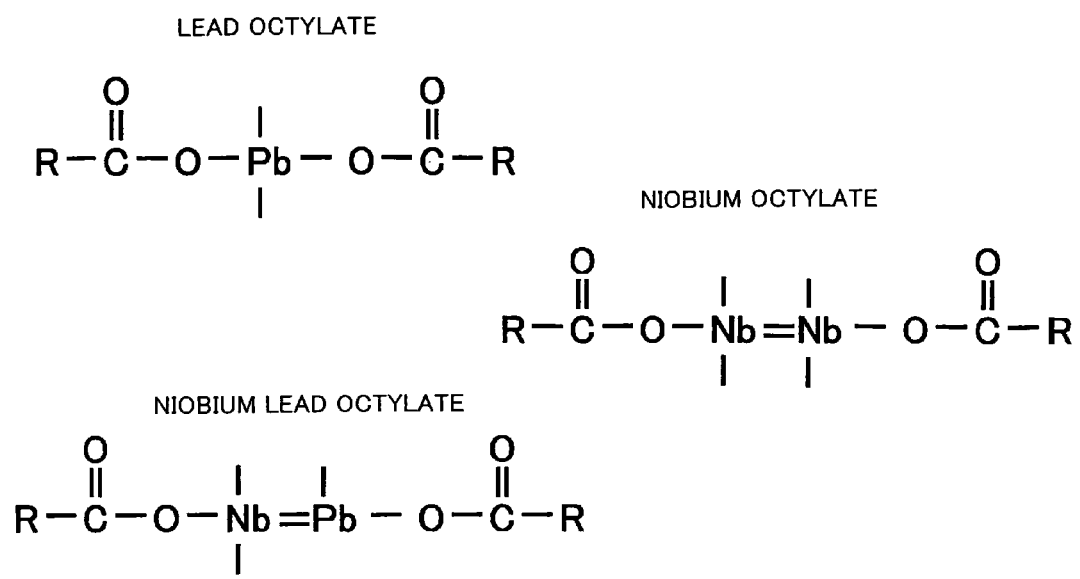
FIG. 2 shows lead-containing carboxylic acids used in the first embodiment.
Figure 3A:
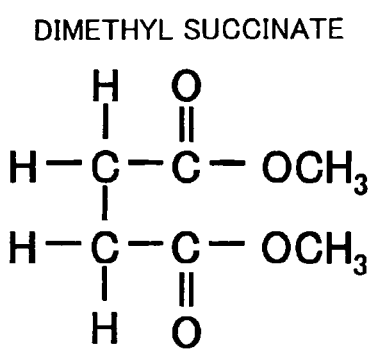
FIGS. 3A to 3D show polycarboxylic acids or polycarboxylic acid esters used in the first embodiment.
Figure 3A:
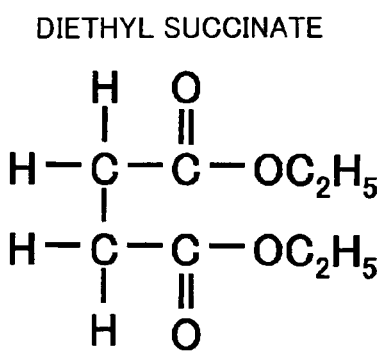
Figure 3B:
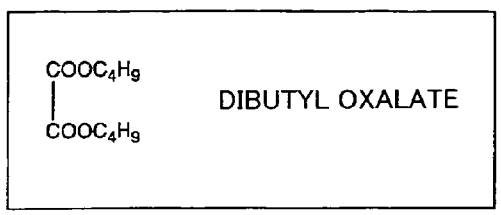
Figure 3B:
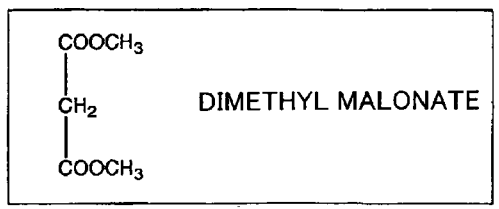
Figure 3B:
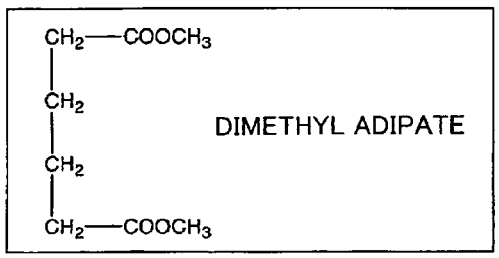
Figure 3B:
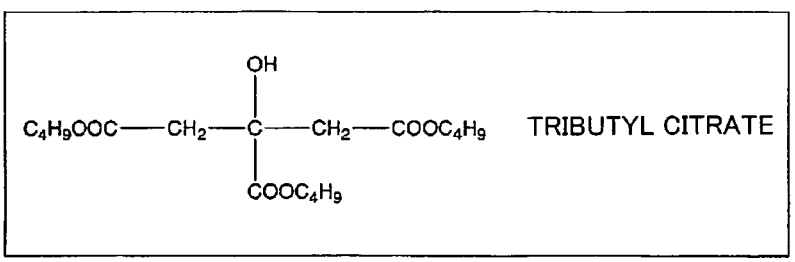
Figure 3B:
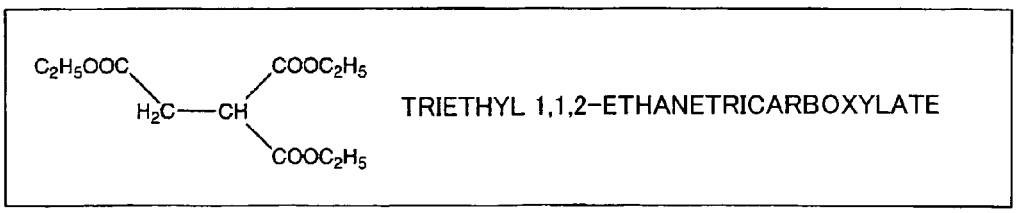
Figure 3B:
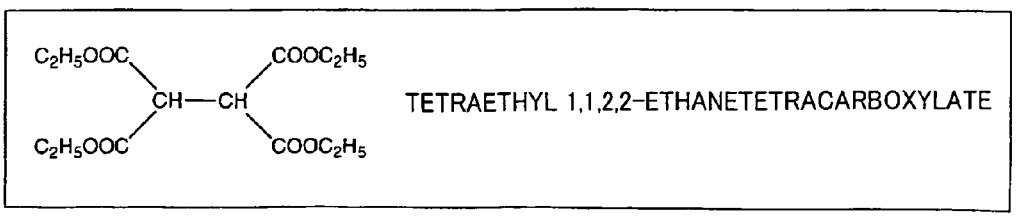
Figure 3C:
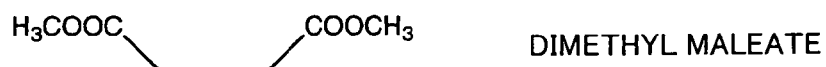
Figure 3C:
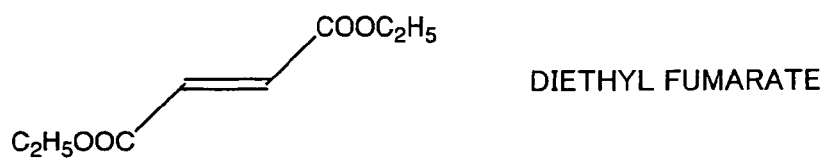
Figure 3C:
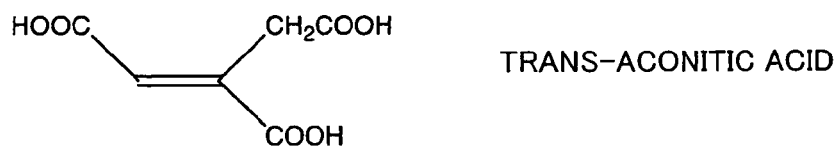
Figure 3D:
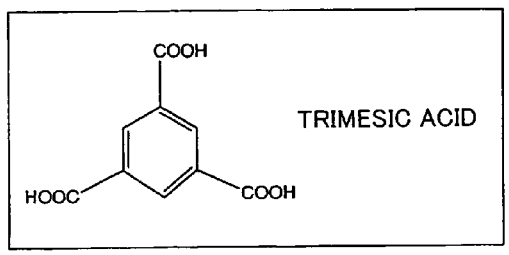
Figure 3D:
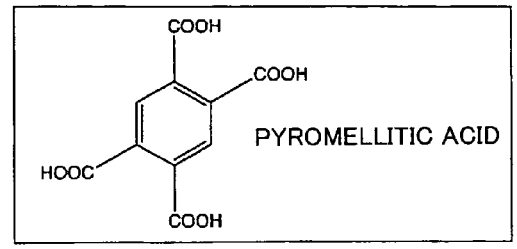
Figure 3D:
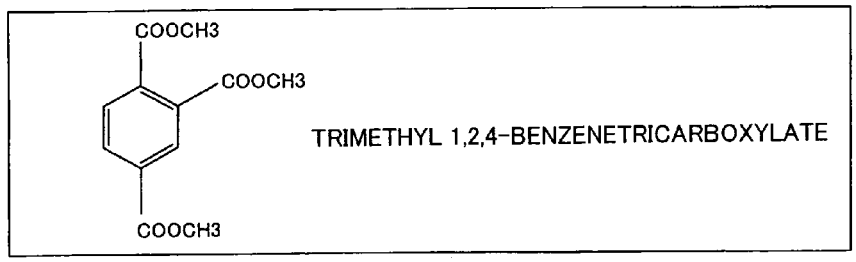
Figure 3D:
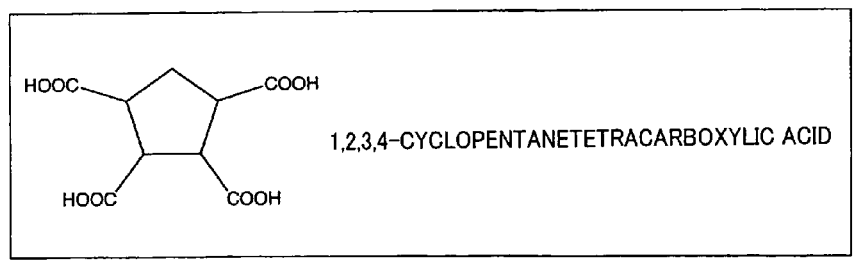

The method of producing the precursor composition may include mixing a sol-gel raw material including a metal carboxylate together with the sol-gel raw material, the polycarboxylic acid or the polycarboxylic acid ester, and the organic solvent. As examples of such a metal carboxylate, lead carboxylate such as lead acetate can be given. Further examples include lead octylate, niobium octylate, and niobium lead octylate as shown in FIG. 2.

In the method of producing the precursor composition, an organometallic compound (MOD raw material) may be mixed together with the sol-gel raw material, the polycarboxylic acid or the polycarboxylic acid ester, and the organic solvent. In the method of producing the precursor composition, not only the alkoxide raw materials, but also the MOD raw material and the alkoxide raw material can be bonded through ester bonds.

As the organometallic compound, niobium octylate or the like may be used. As shown in FIG. 2, niobium octylate has a structure in which two Nb atoms form a covalent bond and an octyl group exists in the remaining site. In this case, since a network other than the two Nb atoms does not exist, niobium octylate is regarded as the MOD raw material.

A network is formed between the carboxylic acid and the MOD raw material mainly through an alcohol exchange reaction. When using niobium octylate, a reaction occurs between the carboxylic acid and the octyl group (alcohol exchange reaction), so that esterification (R—COO—Nb) proceeds. As described above, according to the first embodiment, the molecules of the MOD raw material can be bonded to the precursor network through condensation between the MOD raw material and the alkoxide by esterifying the MOD raw material.

In the method of producing the precursor composition, a solution prepared by mixing at least a $PbZrO_3$ sol-gel solution, a $PbTiO_3$ sol-gel solution, and a $PbNbO_3$ sol-gel solution may be used as the sol-gel solution. For example, the $PbNbO_3$ sol-gel solution may include niobium lead octylate (see FIG. 2) formed by mixing lead octylate with niobium octylate and obtained by the alcohol exchange reaction between lead octylate and niobium octylate.

In the method of producing the precursor composition, a sol-gel raw material including silicon or silicon and germanium may be used as the sol-gel raw material including the hydrolysis-condensation product of the metal alkoxide. The crystallization temperature can be decreased as described above by adding such a sol-gel raw material. As such a sol-gel solution, a $PbSiO_3$ sol-gel solution or a combination of a $PbSiO_3$ sol-gel solution and a $PbGeO_3$ sol-gel solution may be used. The deposition temperature can be reduced by using the sol-gel raw material including silicon or germanium, whereby PZTN can be crystallized at a temperature as low as about 450° C.

Since the precursor of the precursor composition includes a moderate amount of ester bond between the molecular networks, a reversible reaction can occur. Therefore, the polymerized precursor (polymer network) may be decomposed into the metal alkoxide condensate by causing the reaction in the left direction shown in FIG. 4 to occur.

(3) As shown in FIG. 1C, the potassium niobate film 13 is formed on the lead zirconate titanate niobate film 12 by a laser ablation method.

In more detail, a plume is caused to occur by the laser ablation method in which laser light is applied to a potassium niobate film target such as a $K_{0.6}Nb_{0.4}O_y$ target to scatter potassium, niobium, and oxygen from the target. The plume is applied to the R-plane sapphire substrate 11 and comes in contact with the lead zirconate titanate niobate film 12, whereby the potassium niobate film 13 is formed on the lead zirconate titanate niobate film 12.

The laser ablation method is not particularly limited insofar as the plasma of potassium and niobium can sufficiently reach the substrate. As the laser irradiation conditions, the laser energy density may be set at 2 to 4 $J/cm^2$, the laser frequency may be set at 5 to 20 Hz, the target-substrate distance may be set at 30 to 100 mm, the substrate temperature may be set at 600 to 800° C., and the oxygen partial pressure during deposition may be set at $1 \times 10^{-2}$ to 1 Torr, for example.

In this step, the potassium niobate film 13 is epitaxially grown due to the lead zirconate titanate niobate film 12 provided under the potassium niobate film 13, whereby the potassium niobate film 13 has a single crystal structure having the above-described specific orientation.

As the method for scattering the desired atoms from the target, a method of applying argon gas (inert gas) plasma, electron beams, or the like to the surface of the target may be used instead of the method of applying laser light to the surface of the target. Note that it is preferable to use the method of applying laser light to the surface of the target. According to this method, atoms can be easily and reliably scattered from the target using a simple vacuum system provided with a laser light entrance window.

As the laser light applied to the target, pulsed light having a wavelength of about 150 to 300 nm and a pulse length of about 1 to 100 ns is suitably used. Specific examples of the laser light source include excimer lasers such as an ArF excimer laser, KrF excimer laser, and XeCl excimer laser, YAG laser, $YVO_4$ laser, $CO_2$ laser, and the like. Of these, the ArF excimer laser and the KrF excimer laser are particularly suitable. The ArF excimer laser and the KrF excimer laser are easily handled and can cause atoms to be efficiently scattered from the target.

The piezoelectric film laminate 100, in which the lead zirconate titanate niobate film 12 and the potassium niobate film 13 are stacked on the R-plane sapphire substrate 11 in that order, can be obtained by the above-described steps.

In the above-described process, the $K_{0.6}Nb_{0.4}O_y$ target is used in the step (3) of forming the potassium niobate film 13. Note that the composition ratio of the target is not limited thereto. For example, the potassium niobate layer may be formed using a target having a composition ratio suitable for a tri-phase epitaxy method in which a gas phase raw material is deposited on a substrate held at a temperature in a solid-liquid coexistence region and the solid phase is deposited from the liquid phase. In more detail, when the temperature and the molar composition ratio at a eutectic point E of $KNbO_3$ and $3K_2O \cdot Nb_2O_5$ at a specific oxygen partial pressure are respectively indicated by $T_E$ and $x_E$ (x is the molar composition ratio of potassium (K) and niobium (Nb) when indicated by "$K_xNb_{1-x}O_y$"), a plasma plume (gas phase raw material) provided so that the liquid phase composition ratio x immediately after being deposited on a substrate (the substrate in this example is made up of the sapphire substrate 11 and the lead zirconate titanate niobate film 12 formed on the substrate 11) is in the range of "$0.5 \leq x \leq x_E$" is supplied to the substrate. When the complete melting temperature at this oxygen partial pressure and composition ratio x is indicated by $T_m$, the temperature $T_s$ of the substrate is maintained in the range of "$T_E \leq T_s \leq T_m$" so that a $KNbO_3$ single crystal can be deposited on the substrate from $K_xNb_{1-x}O_y$ while evaporating the residual $K_xNb_{1-x}O_y$ liquid deposited on the substrate from the plasma plume 24.

In this example, the laser ablation method is used as the deposition method for the potassium niobate film 13. However, the deposition method is not limited to the laser ablation method. For example, a deposition method, an MOCVD method, or a sputtering method may be used.

In the first embodiment, a potassium niobate solid solution film in which niobium and potassium of potassium niobate are partially replaced with other elements may be used instead of the potassium niobate film 13. As an example of such a potassium niobate solid solution, a solid solution shown by $K_{1-x}Na_xNb_{1-y}Ta_yO_3$ (0<x<1, 0<y<1) can be given.

The manufacturing method according to the first embodiment has the following features.

According to the first embodiment, since the lead zirconate titanate niobate film 12 is obtained by applying the precursor composition to the R-plane sapphire substrate 11 and heating the precursor composition, the lead zirconate titanate niobate film 12 can be obtained by a process easier than the vapor phase method. The lead zirconate titanate niobate film 12, which is a single crystal and has a uniform domain, can be formed on the R-plane sapphire substrate 11. The lead zirconate titanate niobate film 12 functions as a buffer layer having orientation controllability. The potassium niobate film 13 is epitaxially grown on the lead zirconate titanate niobate film 12 as a single crystal film having a uniform domain in the same manner as the lead zirconate titanate niobate film 12.

The potassium niobate film 13 is extremely useful due to its high electromechanical coupling factor, excellent piezoelectricity, excellent insulating properties, and the like, as described above, and may be applied to various applications such as a surface acoustic wave device.

The mechanism by which the lead zirconate titanate niobate (PZTN) film 12 is obtained by the manufacturing method according to the first embodiment is not necessarily clarified. It is considered that the effects of the precursor composition described below cannot be ignored. In the manufacturing method according to the first embodiment, a polymer network is obtained in which the hydrolysis-condensation products (molecular networks) of the metal alkoxide of the sol-gel raw material are bonded through ester bonds by the polycarboxylic acid in the organic solvent of the precursor composition. Therefore, the polymer network includes a moderate amount of ester bond between the molecular networks derived from the hydrolysis-condensation products. The esterification reaction can be easily carried out by controlling the temperature or the like.

Since the precursor composition used in the first embodiment includes a moderate amount of ester bond between the molecular networks, a reversible reaction can occur. Therefore, the polymerized precursor (polymer network) in the composition remaining after depositing the PZTN film can be decomposed into the metal alkoxide (or molecular network of condensation product). Since the metal alkoxide (or molecular network of condensation product) can be recycled as the precursor raw material, a toxic substance such as lead can be recycled. Therefore, it is advantageous from the viewpoint of the environment.

The precursor composition used in the first embodiment can include the lead-containing molecular network (precursor) since lead can be easily incorporated into the precursor network, thereby exhibiting excellent composition controllability.

1.3 EXAMPLE 1

In Example 1, the piezoelectric film laminate 100 (see FIG. 1C) was formed by the following method. In Example 1, a single crystal lead zirconate titanate niobate thin film and a single crystal potassium niobate thin film were obtained.

The R-plane sapphire substrate 11 made of an R surface sapphire single crystal substrate was immersed in an organic solvent and cleaned by washing using an ultrasonic washing machine. As the organic solvent, a 1:1 mixed solution of ethyl alcohol and acetone was used.

In Example 1, a precursor composition was obtained as follows. Specifically, the precursor composition was obtained by mixing first to third raw material solutions, each containing at least one of Pb, Zr, Ti, and Nb, dimethyl succinate as the polycarboxylic acid ester, and n-butanol as the organic solvent. The mixed solution was prepared by dissolving the sol-gel raw material and dimethyl succinate in n-butanol at a ratio of 1:1 (molar ionic concentration).

As the first raw material solution, a solution was used in which a polycondensation product for forming a $PbZrO_3$ perovskite crystal formed by Pb and Zr among the constituent metal elements of PZTN was dissolved in n-butanol in an anhydrous state.

As the second raw material solution, a solution was used in which a polycondensation product for forming a $PbTiO_3$ perovskite crystal formed by Pb and Ti among the constituent metal elements of PZTN was dissolved in n-butanol in an anhydrous state.

As the third raw material solution, a solution was used in which a polycondensation product for forming a $PbNbO_3$ perovskite crystal formed by Pb and Nb among the constituent metal elements of PZTN was dissolved in n-butanol in an anhydrous state.

When forming a $PbZr_{0.2}Ti_{0.6}Nb_{0.2}O_3$ (PZTN) film using the first, second, and third raw material solutions, the raw material solutions are mixed at a ratio of "(first raw material solution):(second raw material solution):(third raw material solution)=2:6:2". In order to reduce the crystallization temperature of the PZTN film, a solution prepared by dissolving a polycondensation product for forming a $PbSiO_3$ crystal in n-butanol in an anhydrous state was added as a fourth raw material solution in an amount of 3 mol %. Specifically, the crystallization temperature of PZTN can be reduced to 700° C. or less by using a mixed solution of the first, second, third, and fourth raw material solutions as the sol-gel raw material.

A sample was obtained by the following method.

The first to fourth raw material solutions and dimethyl succinate were dissolved in n-butanol at room temperature to prepare a solution. The resulting solution was heated at 80° C. for 60 minutes to prepare a solution (precursor composition). The resulting solution was applied to the R-plane sapphire substrate 11 by a spin coating method and dried at 150 to 180° C. (150° C.) using a hot plate to remove the alcohol. Then, a cleaning heat treatment was performed at 300 to 350° C. (300° C.) using a hot plate. The resulting product was subjected to crystallization annealing (sintering) to obtain the PZTN film 12 having a thickness of 50 nm. The crystallization sintering was performed at 650 to 700° C. (700° C.) in an oxygen atmosphere by rapid thermal annealing (RTA).

The sapphire substrate 11 on which the lead zirconate titanate niobate film 12 was formed was installed in a substrate holder and introduced into a vacuum system having a back pressure of $1 \times 10^{-8}$ Torr at room temperature. After introducing oxygen gas so that the oxygen partial pressure was $5 \times 10^{-5}$ Torr, the sapphire substrate 11 was heated to 400° C. at 20° C./min using an infrared lamp.

Then, pulsed light was applied to the surface of a $K_{0.6}Nb_{0.4}O_y$ target from a KrF excimer laser at an energy density of 3 $J/cm^2$, a frequency of 10 Hz, and a pulse length of 10 ns so that a plasma plume of K, Nb, and O was applied to the sapphire substrate 11 placed at a distance of 70 mm from the target for 24 minutes at a substrate temperature of 750° C. and an oxygen partial pressure of $1 \times 10^{-1}$ Torr. As a result, the potassium niobate film 13 was deposited on the lead zirconate titanate niobate film 12 to a thickness of 1 μm.

A sample of the piezoelectric film laminate 100 (see FIG. 1C) was obtained by the above-described steps. The sample was subjected to X-ray analysis. The results are as follows.

Figure 6:
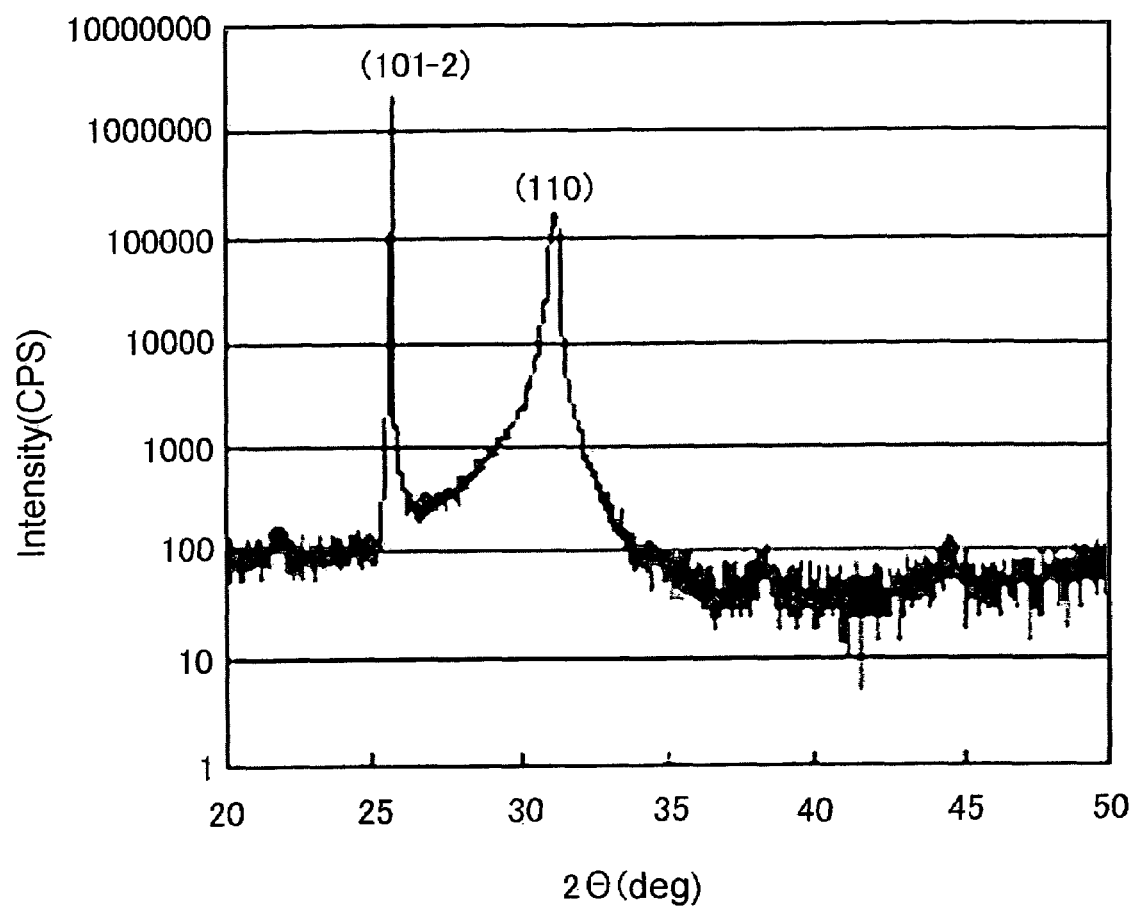
FIG. 6 is an X-ray diffraction diagram of lead zirconate titanate niobate according to Example 1.

FIG. 6 shows the X-ray diffraction pattern (2θ-θ scan) of the lead zirconate titanate niobate film 12 and the potassium niobate film 13 of the sample. The peaks shown in the X-ray diffraction pattern of FIG. 6 are attributed to sapphire, lead zirconate titanate niobate, and potassium niobate. A peak attributed to a compound other than sapphire, lead zirconate titanate niobate, and potassium niobate was not observed. Therefore, the peak of a tetragonal (110) orientation (or (101) orientation) was observed for the lead zirconate titanate niobate obtained in Example 1, and the peak of an orthorhombic (110) orientation (or (111) or (001) orientation) was observed for the potassium niobate obtained in Example 1. The peaks of the lead zirconate titanate niobate and the potassium niobate overlap in FIG. 6.

Figure 7A:
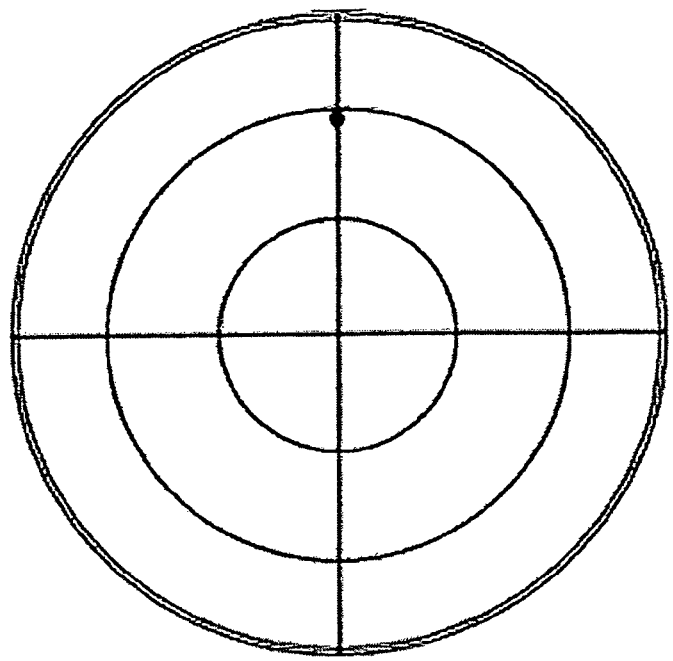
FIGS. 7A and 7B are X-ray diffraction pole figures of an R-plane sapphire substrate and lead zirconate titanate niobate according to Example 1.
Figure 7B:
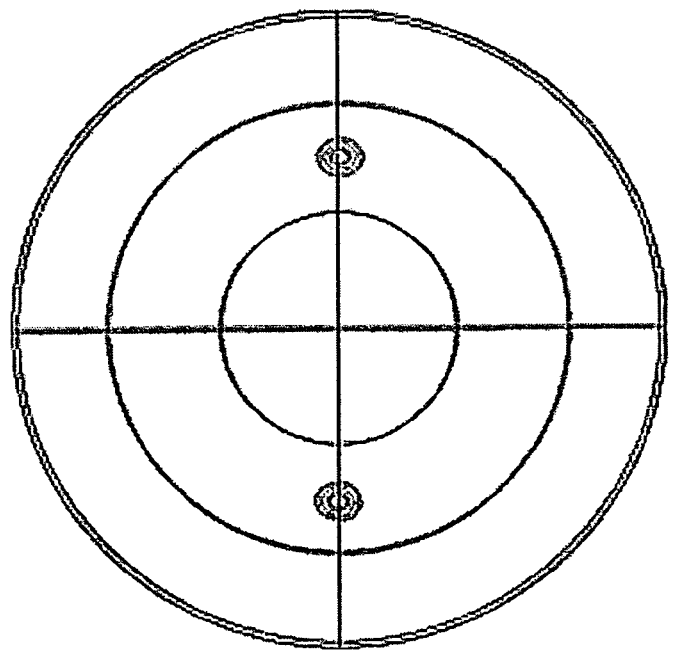

FIGS. 7A and 7B are X-ray diffraction pole figures of sapphire (0006) (2θ=41.7°) and PZTN (200) and $KNbO_3$ $(200)_{PC}$ (2θ=44.8%, respectively. As is clear from these results, it was confirmed that PZTN (200) and KNbO$_3$ (200)$_{PC}$ had twofold symmetry, and had an interlayer epitaxial orientation relationship of "KNbO$_3$ (110)$_{PC}$/PZTN (110)/sapphire (1-102)" and an inplane epitaxial orientation relationship of "KNbO$_3$ [001]$_{PC}$/PZTN [001]//sapphire [11-20]". Specifically, the PZTN was epitaxially grown in a tetragonal (110) or (101) orientation or a rhombohedral (110) orientation, and the [001] axis when the PZTN was grown in the tetragonal (110) orientation, the [010] axis when the PZTN was grown in the tetragonal (101) orientation, or the [001] axis when the PZTN was grown in the rhombohedral (110) orientation was parallel to the [11-20] direction of the R plane of the sapphire substrate. The KNbO$_3$ was epitaxially grown in an orthorhombic (111), (100), or (001) orientation when the orthorhombic indices are defined as "$2^{1/2}$b<a<c", and the [10-1] axis when the KNbO$_3$ was grown in the orthorhombic (111) orientation or the [010] axis when the KNbO$_3$ was grown in the orthorhombic (100) or (001) orientation was parallel to the [11-20] direction of the R plane of the sapphire substrate. Therefore, it was confirmed that the lead zirconate titanate niobate film 12 and the potassium niobate film 13 according to Example 1 were single crystals and had a single domain structure, in which the crystal growth direction was uniform, by a polarization treatment or the like or spontaneously.

2. Second Embodiment 2.1. Piezoelectric Film Laminate

Figure 8:
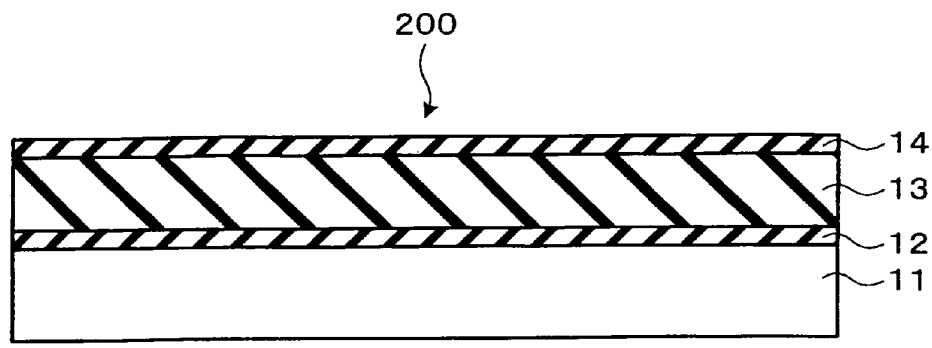
FIG. 8 is a cross-sectional view schematically showing a piezoelectric film laminate according to the second embodiment of the invention.

FIG. 8 is a cross-sectional view schematically showing a piezoelectric film laminate 200 according to a second embodiment.

As shown in FIG. 8, the piezoelectric film laminate 200 according to the second embodiment may include the substrate 11, and a piezoelectric film laminate formed on the substrate 11 and including the first lead zirconate titanate niobate film 12, the potassium niobate film 13, and a second lead zirconate titanate niobate film 14. The substrate 11, the first lead zirconate titanate niobate film 12, and the potassium niobate film 13 are substantially the same as those of the piezoelectric film laminate 100 according to the first embodiment. The second embodiment merely differs from the first embodiment in that the second lead zirconate titanate niobate film 14 is formed on the potassium niobate film 13. Therefore, detailed description of the same members as in the first embodiment is omitted.

As the substrate 11, an R-plane sapphire substrate may be used in the same manner as in the first embodiment.

The first lead zirconate titanate niobate (Pb(Zn,Ti,Nb)O$_3$) (hereinafter may be called "PZTN") film 12 is epitaxially grown in a tetragonal (110) or (101) orientation or a rhombohedral (110) orientation in the same manner as in the first embodiment. The first lead zirconate titanate niobate film 12 has twofold inplane symmetry. Specifically, since the first lead zirconate titanate niobate film 12 has a single crystal structure differing from those of known films and has twofold symmetry, the first lead zirconate titanate niobate film 12 has a single domain structure without different domains.

The [001] axis when the first lead zirconate titanate niobate film 12 is grown in the tetragonal (110) orientation, the [010] axis when the first lead zirconate titanate niobate film 12 is grown in the tetragonal (101) orientation, or the [001] axis when the first lead zirconate titanate niobate film 12 is grown in the rhombohedral (110) orientation is parallel to the [11-20] direction of the R plane of the sapphire substrate.

The potassium niobate (KNbO$_3$) film 13 is epitaxially grown in an orthorhombic (111), (100), or (001) orientation in the same manner as in the first embodiment when the orthorhombic indices are defined as "$2^{1/2}$b<a<c". The potassium niobate film 13 has twofold inplane symmetry. Specifically, since the potassium niobate film 13 has a single crystal structure differing from those of known films and has twofold symmetry, the potassium niobate film 13 has a single domain structure without different domains.

The [10-1] axis when the potassium niobate film 13 is grown in the orthorhombic (111) orientation or the [010] axis when the potassium niobate film 13 is grown in the orthorhombic (100) or (001) orientation is parallel to the [11-20] direction of the R plane of the sapphire substrate.

The second lead zirconate titanate niobate film 14 is formed on the potassium niobate film 13 and has the same features as the first lead zirconate titanate niobate film 12. Specifically, the second lead zirconate titanate niobate film 14 is epitaxially grown in a tetragonal (110) or (101) orientation or a rhombohedral (110) orientation. The second lead zirconate titanate niobate film 14 has twofold inplane symmetry. Specifically, since the lead zirconate titanate niobate film 14 has a single crystal structure and has twofold symmetry, the lead zirconate titanate niobate film 14 has a single domain structure by a polarization treatment or the like or spontaneously.

The [001] axis when the second lead zirconate titanate niobate film 14 is grown in the tetragonal (110) orientation, the [010] axis when the second lead zirconate titanate niobate film 14 is grown in the tetragonal (101) orientation, or the [001] axis when the second lead zirconate titanate niobate film 14 is grown in the rhombohedral (110) orientation is parallel to the [11-20] direction of the R plane of the sapphire substrate.

As described above, since the first lead zirconate titanate niobate film 12, the potassium niobate film 13, and the second lead zirconate titanate niobate film 14 forming the piezoelectric film laminate 200 according to the second embodiment are epitaxially grown single crystals and have a single domain structure, a domain boundary does not exist. Therefore, the first lead zirconate titanate niobate film 12, the potassium niobate film 13, and the second lead zirconate titanate niobate film 14 show a small energy loss at the crystal grain boundaries and a small surface acoustic wave propagation loss and therefore have a high electromechanical coupling factor.

The first and second lead zirconate titanate niobate films 12 and 14 may include niobium in an amount of preferably 5 mol % or more, and still more preferably 10 to 30 mol % of the total amount of niobium, titanium, and zirconium. The lead zirconate titanate niobate film according to the second embodiment may include silicon or silicon and germanium in an amount of preferably 0.5 mol % or more, and still more preferably 0.5 to 5 mol %. The features of the lead zirconate titanate niobate films 12 and 14 due to inclusion of niobium are the same as in the first embodiment. Therefore, detailed description thereof is omitted.

As described above, since the first lead zirconate titanate niobate film 12, the potassium niobate film 13, and the second lead zirconate titanate niobate film 14 are single crystals having a specific orientation and have a single domain structure, the piezoelectric film laminate 200 according to the second embodiment exhibits excellent properties such as a high electromechanical coupling factor, excellent piezoelectricity, and excellent insulating properties.

Moreover, since the lead zirconate titanate niobate films 12 and 14 have an excellent surface morphology, the interface with a film (e.g. conductive film) formed on the lead zirconate titanate niobate film can be improved.

Therefore, the piezoelectric film laminate 200 including the first lead zirconate titanate niobate film 12, the potassium niobate film 13, and the second lead zirconate titanate niobate film 14 may be suitably applied to a surface acoustic wave device, a frequency filter, an oscillator, or the like, as described later.

The thickness of the first lead zirconate titanate niobate film 12 is not particularly limited insofar as the potassium niobate film 13 can be epitaxially grown. The thickness of the first lead zirconate titanate niobate film 12 may be 10 to 100 nm, for example. The thickness of the potassium niobate film 13 is not particularly limited, and is selected depending on the device to which the piezoelectric film laminate 100 is applied. The thickness of the potassium niobate film 13 may be 100 nm to 100 µm, for example. The thickness of the second lead zirconate titanate niobate film 14 is not particularly limited insofar as the surface morphology of the piezoelectric film laminate can be improved. The thickness of the second lead zirconate titanate niobate film 14 may be 10 to 100 nm, for example.

2.2. Method of Manufacturing Piezoelectric Film Laminate

A method of manufacturing the piezoelectric film laminate 200 according to the second embodiment is described below with reference to FIG. 8. The formation methods for the first lead zirconate titanate niobate film 12 and the potassium niobate film 13 are the same as in the first embodiment. Therefore, detailed description thereof is omitted.

(1) The substrate 11 (hereinafter may be called "R-plane sapphire substrate") made of an R-plane sapphire substrate is provided.

(2) A precursor composition is applied to the R-plane sapphire substrate 11 and heated to form the first lead zirconate titanate niobate film 12.

The precursor composition used in this step is the same as in the first embodiment. Therefore, detailed description thereof is omitted.

(3) The potassium niobate film 13 is formed on the lead zirconate titanate niobate film 12 by a laser ablation method.

In more detail, a plume is caused to occur by the laser ablation method in which laser light is applied to a potassium niobate film target such as a $K_{0.6}Nb_{0.4}O_y$ target to scatter potassium, niobium, and oxygen from the target. The plume is applied to the R-plane sapphire substrate 11 and comes in contact with the lead zirconate titanate niobate film 12, whereby the potassium niobate film 13 is formed on the lead zirconate titanate niobate film 12. The conditions for the laser ablation method are the same as in the first embodiment.

In this step, the potassium niobate film 13 is epitaxially grown due to the lead zirconate titanate niobate film 12 provided under the potassium niobate film 13, whereby the potassium niobate film 13 has a single crystal structure having the above-described specific orientation.

(4) The second lead zirconate titanate niobate film 14 is formed on the potassium niobate film 13. The formation method for the lead zirconate titanate niobate film 14 is the same as the formation method for the first lead zirconate titanate niobate film 12 in the step (2). Specifically, a precursor composition is applied to the potassium niobate film 13 and heated to form the second lead zirconate titanate niobate film 14. The second lead zirconate titanate niobate film 14 is epitaxially grown due to the potassium niobate film 13 provided under the second lead zirconate titanate niobate film 14, whereby the second lead zirconate titanate niobate film 14 has a single crystal structure having the above-described specific orientation.

The piezoelectric film laminate 200, in which the first lead zirconate titanate niobate film 12, the potassium niobate film 13, and the second lead zirconate titanate niobate film 14 are stacked on the R-plane sapphire substrate 11 in that order, can be obtained by the above-described steps.

In the above-described process, the $K_{0.6}Nb_{0.4}O_y$ target is used in the step (3) of forming the potassium niobate film 13. Note that the composition ratio of the target is not limited thereto. For example, the potassium niobate layer may be formed using a target having a composition ratio suitable for the tri-phase epitaxy method, as described in the first embodiment, in which a gas phase raw material is deposited on a substrate held at a temperature in a solid-liquid coexistence region and the solid phase is deposited from the liquid phase. In this example, the laser ablation method is used as the deposition method for the potassium niobate film 13. However, the deposition method is not limited to the laser ablation method. For example, a deposition method, an MOCVD method, or a sputtering method may also be used.

In the second embodiment, a potassium niobate solid solution film in which niobium and potassium of potassium niobate are partially replaced with other elements may be used instead of the potassium niobate film 13. As an example of such a potassium niobate solid solution, a solid solution shown by $K_{1-x}Na_xNb_{1-y}Ta_yO_3$ (0<x<1, 0<y<1) can be given.

The manufacturing method according to the second embodiment has the following features.

According to the second embodiment, since the first lead zirconate titanate niobate film 12 is obtained by applying the precursor composition to the R-plane sapphire substrate 11 and heating the applied precursor composition in the same manner as in the first embodiment, the first lead zirconate titanate niobate film 12 can be obtained by a process easier than the vapor phase method. The first lead zirconate titanate niobate film 12 obtained by this step is a single crystal and has a crystal structure with a uniform domain. The first lead zirconate titanate niobate film 12 functions as a buffer layer having orientation controllability. Therefore, the potassium niobate film 13 and the second lead zirconate titanate niobate film 14 are epitaxially grown over the first lead zirconate titanate niobate film 12 as single-domain single-crystal films in the same manner as the lead zirconate titanate niobate film 12.

The potassium niobate film 13 and the second lead zirconate titanate niobate film 14 have a high electromechanical coupling factor, excellent insulating properties, and the like, as described above. Since the second lead zirconate titanate niobate film 14 has an excellent surface morphology, a conductive film having an excellent interfacial state can be formed on the second lead zirconate titanate niobate film 14. Therefore, the piezoelectric film laminate 200 according to the second embodiment may be applied to various applications such as a surface acoustic wave device.

The lead zirconate titanate niobate (PZTN) films 12 and 14 are obtained by the manufacturing method according to the second embodiment for the same reasons as described in the first embodiment.

2.3. EXAMPLE 2

In Example 2, the piezoelectric film laminate 200 (see FIG. 8) was formed by the following method. In Example 2, single crystal lead zirconate titanate niobate thin films and a single crystal potassium niobate thin film were obtained.

The R-plane sapphire substrate 11 made of an R-plane sapphire single crystal substrate was immersed in an organic solvent and cleaned by washing using an ultrasonic washing machine. As the organic solvent, a 1:1 mixed solution of ethyl alcohol and acetone was used.

In Example 2, a precursor composition similar to that described in "1.3. Example 1" was used.

A sample was obtained by the following method.

A solution (precursor composition) was prepared at room temperature in the same manner as in Example 1. The resulting solution was applied to the R-plane sapphire substrate 11 by a spin coating method and dried at 150 to 180° C. (150° C.) using a hot plate to remove the alcohol. A cleaning heat treatment was then performed at 300 to 350° C. (300° C.) using a hot plate. The resulting product was subjected to crystallization annealing (sintering) to obtain the first PZTN film 12 having a thickness of 50 nm. The crystallization sintering was performed at 650 to 700° C. (700° C.) in an oxygen atmosphere by rapid thermal annealing (RTA).

The sapphire substrate 11 on which the lead zirconate titanate niobate film 12 was formed was installed in a substrate holder and introduced into a vacuum system having a back pressure of $1 \times 10^{-8}$ Torr at room temperature. After introducing oxygen gas so that the oxygen partial pressure was $5 \times 10^{-5}$ Torr, the sapphire substrate 11 was heated to 400° C. at 20° C./min using an infrared lamp.

Then, pulsed light was applied to the surface of a $K_{0.6}Nb_{0.4}O_y$ target from a KrF excimer laser at an energy density of 3 J/cm², a frequency of 10 Hz, and a pulse length of 10 ns so that a plasma plume of K, Nb, and O was applied to the sapphire substrate 11 placed at a distance of 70 mm from the target for 24 minutes at a substrate temperature of 750° C. and an oxygen partial pressure of $1 \times 10^{-1}$ Torr. As a result, the potassium niobate film 13 was deposited on the lead zirconate titanate niobate film 12 to a thickness of 1 μm.

After applying a precursor composition similar to that of Example 1 to the potassium niobate film 13, the applied precursor composition was treated in the same manner as in the formation step of the first PZTN film 12 to obtain the second PZTN film 14 having a thickness of 50 nm.

A sample of the piezoelectric film laminate 200 (see FIG. 18) was obtained by the above-described steps. The sample was subjected to X-ray analysis. As a result, results similar to those shown in FIGS. 6, 7A, and 7B were obtained.

Specifically, the peak of a tetragonal (110) orientation (or (101) orientation) was observed for the first and second lead zirconate titanate niobates obtained in Example 2, and the peak of an orthorhombic (110) orientation (or (111) or (001) orientation) was observed for the potassium niobate obtained in Example 2. From the results of the X-ray diffraction pole figures, it was confirmed that PZTN (200) and $KNbO_3$ $(200)_{PC}$ had twofold symmetry, and had an interlayer epitaxial orientation relationship of "$KNbO_3$ $(110)_{PC}$/PZTN (110)/sapphire (1-102)" and an inplane epitaxial orientation relationship of "$KNbO_3$ $[001]_{PC}$/PZTN [001]//sapphire [11-20]". Specifically, the PZTN was epitaxially grown in a tetragonal (110) or (101) orientation or a rhombohedral (110) orientation, and the [001] axis when the PZTN was grown in the tetragonal (110) orientation, the [010] axis when the PZTN was grown in the tetragonal (101) orientation, or the [001] axis when the PZTN was grown in the rhombohedral (110) orientation was parallel to the [11-20] direction of the R plane of the sapphire substrate. The $KNbO_3$ was epitaxially grown in an orthorhombic (111), (100), or (001) orientation when the orthorhombic indices are defined as "$2^{1/2}b<a<c$", and the [10-1] axis when the $KNbO_3$ was grown in the orthorhombic (111) orientation or the [010] axis when the $KNbO_3$ was grown in the orthorhombic (100) or (001) orientation was parallel to the [11-20] direction of the R plane of the sapphire substrate. Therefore, it was confirmed that the lead zirconate titanate niobate films 12 and 14 and the potassium niobate film 13 according to Example 2 were single crystals and had a single domain structure in which the crystal growth direction was uniform.

3. Third Embodiment

Figure 9:
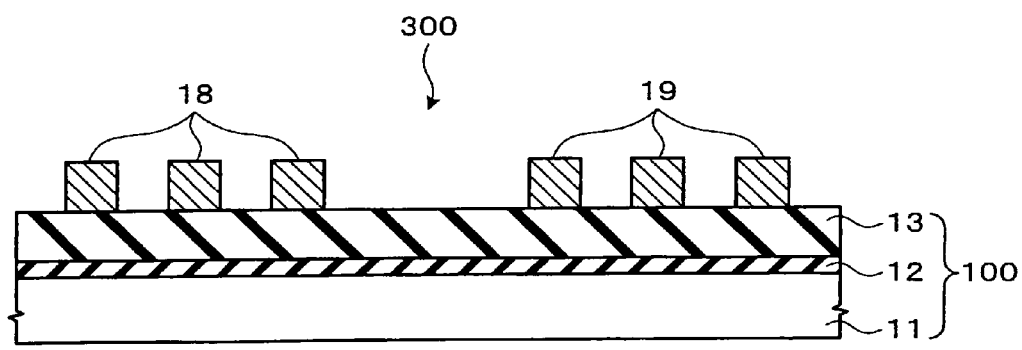
FIG. 9 is a cross-sectional view showing a surface acoustic wave device according to the third embodiment of the invention.

An example of a surface acoustic wave device according to a third embodiment to which the invention is applied is described below with reference to the drawings. FIG. 9 is a cross-sectional view schematically showing a surface acoustic wave device 300 according to the third embodiment. In FIG. 9, members substantially the same as the members of the piezoelectric film laminate 100 shown in FIGS. 1A to 1C are indicated by the same symbols. Detailed description of these members is omitted.

The surface acoustic wave device 300 includes the substrate 11, a piezoelectric film laminate formed on the substrate 11 and including the lead zirconate titanate niobate film 12 and the potassium niobate film 13, and interdigital transducers (hereinafter called "IDT electrodes") 18 and 19 formed on the potassium niobate film 13. The IDT electrodes 18 and 19 have a specific pattern.

The surface acoustic wave device 300 according to the third embodiment includes the piezoelectric film laminate according to the invention, such as the piezoelectric film laminate 100 shown in FIGS. 1A to 1C. Therefore, the lead zirconate titanate niobate film 12 and the potassium niobate film 13 forming the surface acoustic wave device 300 have the features described in the first embodiment. Specifically, the lead zirconate titanate niobate film 12 and the potassium niobate film 13 have an epitaxially grown single crystal structure having a specific orientation and a twofold symmetry.

The surface acoustic wave device 300 according to the third embodiment is formed as described below using the piezoelectric film laminate according to the invention, for example.

A metal layer is formed on the lead zirconate titanate niobate film 12 of the piezoelectric film laminate 100 shown in FIGS. 1A to 1C by a vacuum deposition method, for example. Aluminum may be used as the material for the metal layer, for example. The IDT electrodes 18 and 19 are formed on the lead zirconate titanate niobate film 12 by patterning the metal film using a known lithography technology and etching technology.

The surface acoustic wave device 300 according to the third embodiment includes the lead zirconate titanate niobate film 12 and the potassium niobate film 13 according to the invention. Therefore, according to the third embodiment, a surface acoustic wave device having a high electromechanical coupling factor can be realized.

An experimental example conducted on the surface acoustic wave device 300 according to the third embodiment is described below.

The surface acoustic wave device 300 of the example was formed using the piezoelectric film laminate 100 of the example of the first embodiment. As the IDT electrode, an aluminum film having a thickness of 100 nm was used. The line and space (L & S) of the IDT electrode was 1.25 μm.

The resulting surface acoustic wave device 300 was subjected to measurement of the surface acoustic wave propagation velocity $V_{open}$ between the IDT electrodes 18 and 19. The speed of sound determined from the results was 5000 m/s. The electromechanical coupling factor calculated from the difference between the surface acoustic wave propagation velocity $V_{open}$ and the surface acoustic wave propagation velocity $V_{short}$ when covering the area between the IDT electrodes 18 and 19 with a metal thin film was 5%.

When directly forming the potassium niobate film on the sapphire substrate without using the lead zirconate titanate niobate film 12, the electromechanical coupling factor was 2%. Therefore, it was confirmed according to the third embodiment that the electromechanical coupling factor is improved by forming the potassium niobate film 13 on the potassium niobate film 12.

4. Fourth Embodiment

Figure 10:
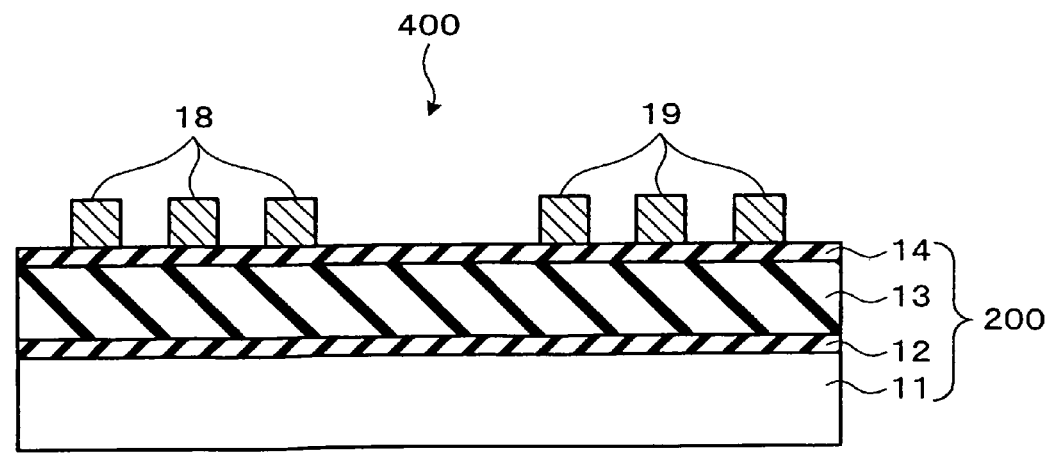
FIG. 10 is a cross-sectional view showing a surface acoustic wave device according to the fourth embodiment of the invention.

An example of a surface acoustic wave device according to a fourth embodiment to which the invention is applied is described below with reference to the drawings. FIG. 10 is a cross-sectional view schematically showing a surface acoustic wave device 400 according to the fourth embodiment. In FIG. 10, members substantially the same as the members of the piezoelectric film laminate 200 shown in FIG. 8 are indicated by the same symbols. Detailed description of these members is omitted.

The surface acoustic wave device 400 includes the substrate 11, a piezoelectric film laminate formed on the substrate 11 and including the first lead zirconate titanate niobate film 12, the potassium niobate film 13, and the second lead zirconate titanate niobate film 14, and the interdigital transducers (hereinafter called "IDT electrodes") 18 and 19 formed on the second lead zirconate titanate niobate film 14. The IDT electrodes 18 and 19 have a specific pattern.

The surface acoustic wave device 400 according to the fourth embodiment includes the piezoelectric film laminate according to the invention, such as the piezoelectric film laminate 200 shown in FIG. 8. Therefore, the lead zirconate titanate niobate films 12 and 14 and the potassium niobate film 13 forming the surface acoustic wave device 400 have the features described in the second embodiment. Specifically, the lead zirconate titanate niobate films 12 and 14 and the potassium niobate film 13 have an epitaxially grown single crystal structure having a specific orientation and a twofold symmetry.

The surface acoustic wave device 400 according to the fourth embodiment is formed as described below using the piezoelectric film laminate according to the invention, for example.

A metal layer is formed on the second lead zirconate titanate niobate film 14 of the piezoelectric film laminate 200 shown in FIG. 8 by a vacuum deposition method, for example. Aluminum may be used as the material for the metal layer, for example. The IDT electrodes 18 and 19 are formed on the second lead zirconate titanate niobate film 14 by patterning the metal film using a known lithography technology and etching technology. According to the fourth embodiment, since the surface morphology of the piezoelectric film laminate is significantly improved by the second lead zirconate titanate niobate film 14, the IDT electrodes 18 and 19 with an excellent interface state can be formed, for example.

The surface acoustic wave device 400 according to the fourth embodiment includes the potassium niobate film 13 and the second lead zirconate titanate niobate film 14 which mainly determine the device properties. Therefore, according to the fourth embodiment, a surface acoustic wave device having a high electromechanical coupling factor can be realized.

An experimental example conducted on the surface acoustic wave device 400 according to the fourth embodiment is described below.

The surface acoustic wave device 400 of the example was formed using the piezoelectric film laminate 200 of the example of the second embodiment. As the IDT electrode, an aluminum layer having a thickness of 100 nm was used. The line and space (L & S) of the IDT electrode was 1.25 µm.

The resulting surface acoustic wave device 400 was subjected to measurement of the surface acoustic wave propagation velocity $V_{open}$ between the IDT electrodes 18 and 19. The speed of sound determined from the result was 5000 m/s. The electromechanical coupling factor calculated from the difference between the surface acoustic wave propagation velocity $V_{open}$ and the surface acoustic wave propagation velocity $V_{short}$ when covering the area between the IDT electrodes 18 and 19 with a metal thin film was 10%.

When directly forming the potassium niobate film on the sapphire substrate without using the lead zirconate titanate niobate film 12, the electromechanical coupling factor was 2%. Therefore, it was confirmed according to the fourth embodiment that the electromechanical coupling factor is improved by forming the potassium niobate film 13 on the potassium niobate film 12. It was also confirmed that the electromechanical coupling factor is further improved in comparison with the example of the third embodiment by forming the lead zirconate titanate niobate film 14 on the potassium niobate film 13.

5. Fifth Embodiment

Figure 11:
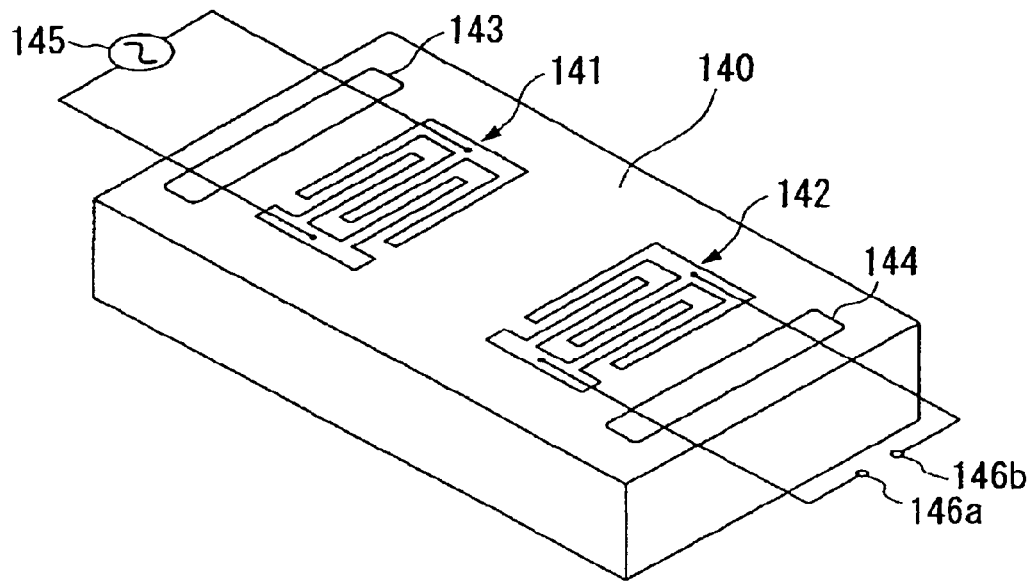
FIG. 11 is an oblique view showing a frequency filter according to the fifth embodiment of the invention.

An example of a frequency filter according to a fifth embodiment to which the invention is applied is described below with reference to the drawings. FIG. 11 is a view schematically showing the frequency filter according to the fifth embodiment.

As shown in FIG. 11, the frequency filter includes a base 140. As the base 140, a piezoelectric film laminate according to the invention, such as the piezoelectric film laminate 100 or 200 shown in FIGS. 1A to 1C or FIG. 8, may be used.

IDT electrodes 141 and 142 are formed on the upper side of the base 140. Sound absorbing sections 143 and 144 are formed on the upper side of the base 140 so that the IDT electrodes 141 and 142 are positioned between the sound absorbing sections 143 and 144. The sound absorbing sections 143 and 144 absorb surface acoustic waves propagated on the surface of the base 140. A high-frequency signal source 145 is connected with the IDT electrode 141, and signal lines are connected with the IDT electrode 142.

The operation of the frequency filter is described below.

In the above-described configuration, when a high-frequency signal is output from the high-frequency signal source 145, the high-frequency signal is applied to the IDT electrode 141, whereby surface acoustic waves occur on the upper side of the base 140. The surface acoustic waves propagated from the IDT electrode 141 toward the sound absorbing section 143 are absorbed by the sound absorbing section 143. However, the surface acoustic waves propagated toward the sound absorbing section 142 and having a specific frequency determined by the pitch of the IDT electrode 142 or the like or having a frequency in a specific band are converted into electric signals, and supplied to terminals 146a and 146b through the signal lines. Most of the frequency components other than the specific frequency or the frequency in the specific band are absorbed by the sound absorbing section 144 through the IDT electrode 142. Therefore, it is possible to obtain (filter) only surface acoustic waves having the specific frequency or the frequency in the specific band from the electric signals supplied to the IDT electrode 141 of the frequency filter according to the fifth embodiment.

6. Sixth Embodiment

Figure 12:
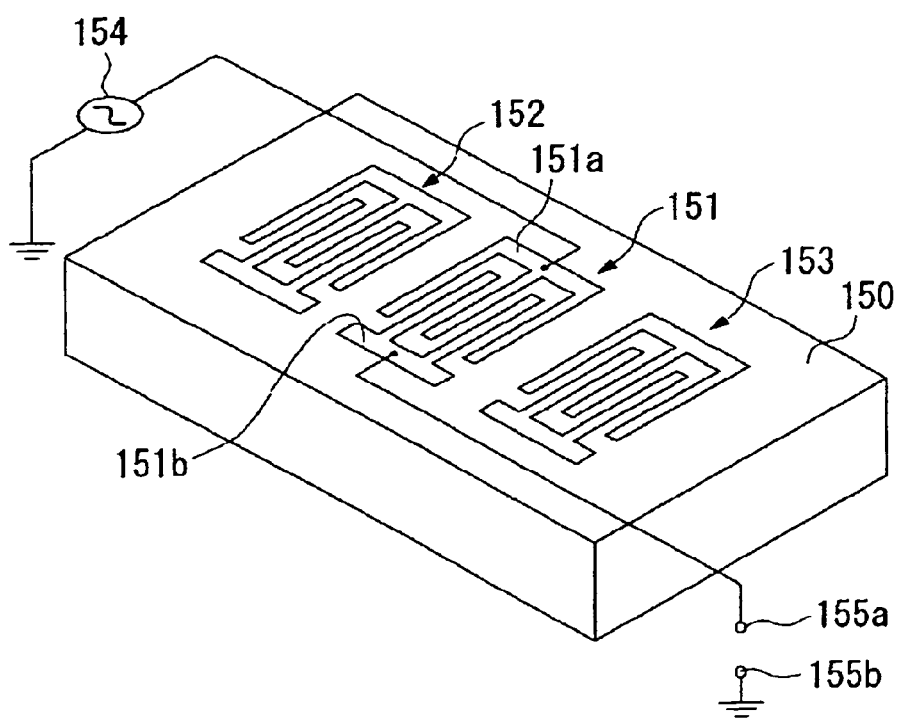
FIG. 12 is an oblique view showing an oscillator according to the sixth embodiment of the invention.

An example of an oscillator according to a sixth embodiment to which the invention is applied is described below with reference to the drawings. FIG. 12 is a view schematically showing the oscillator according to the sixth embodiment.

As shown in FIG. 12, the oscillator includes a base 150. As the base 150, a piezoelectric film laminate according to the invention, such as the piezoelectric film laminate 100 or 200 shown in FIGS. 1A to 1C or FIG. 8, may be used in the same manner as the above-describe frequency filter.

An IDT electrode 151 is formed on the upper side of the base 150, and IDT electrodes 152 and 153 are formed so that the IDT electrode 151 is positioned between the IDT electrodes 152 and 153. A high-frequency signal source 154 is connected with a comb-shaped electrode 151a forming the IDT electrode 151, and a signal line is connected with the other comb-shaped electrode 151b. The IDT electrode 151 corresponds to an electrode for applying an electric signal, and the IDT electrodes 152 and 153 correspond to electrodes for causing a specific frequency component or a frequency component in a specific band of surface acoustic waves generated by the IDT electrode 151 to resonate.

The operation of the oscillator is described below.

In the above-described configuration, when a high-frequency signal is output from the high-frequency signal source 154, the high-frequency signal is applied to the comb-shaped electrode 151a of the IDT electrode 151, whereby surface acoustic waves propagated toward the IDT electrode 152 and surface acoustic waves propagated toward the IDT electrode 153 are generated on the upper side of the base 150. The surface acoustic waves having a specific frequency component are reflected by the IDT electrodes 152 and 153 so that stationary waves occur between the IDT electrodes 152 and 153. The surface acoustic waves having a specific frequency component are repeatedly reflected by the IDT electrodes 152 and 153, whereby a specific frequency component or a frequency component in a specific band resonates to increase the amplitude. A part of the surface acoustic waves having the specific frequency component or the frequency component in the specific band is removed through the comb-shaped electrode 151b of the IDT electrode 151, whereby electric signals having a frequency corresponding to the resonant frequency of the IDT electrodes 152 and 153 (or frequency having a certain band) can be supplied to terminals 155a and 155b.

Figure 13:
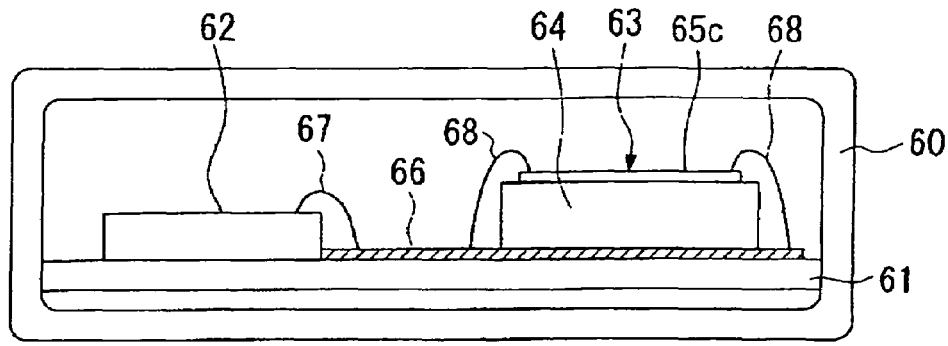
FIG. 13 is a schematic view showing an example in which the oscillator according to the sixth embodiment is applied to a VCSO.
Figure 14:
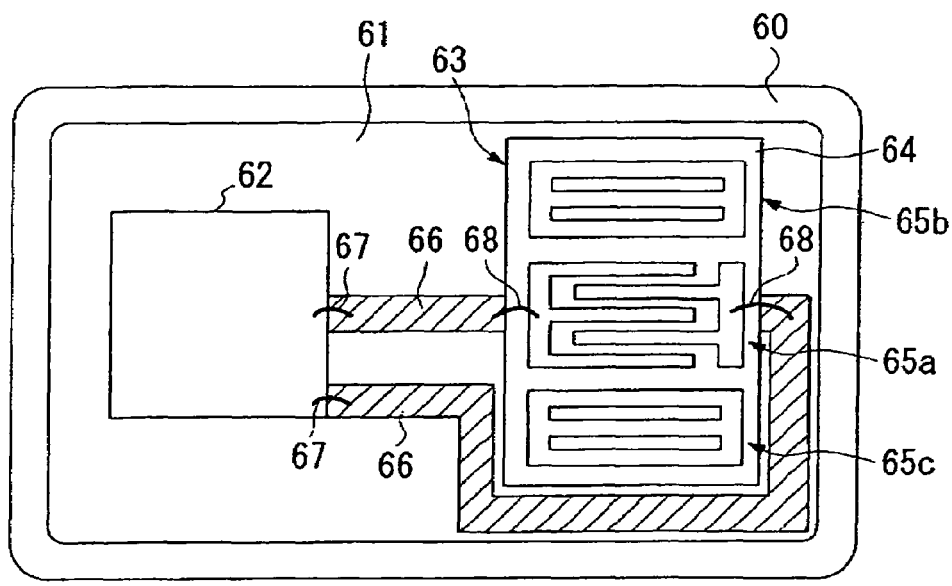
FIG. 14 is a schematic view showing an example in which the oscillator according to the sixth embodiment is applied to a VCSO.

FIGS. 13 and 14 are views schematically showing an example in which the above-described oscillator is applied to a voltage controlled SAW oscillator (VCSO). FIG. 13 is a side perspective view, and FIG. 14 is a top perspective view.

The VCSO is provided in a housing 60 made of a metal (aluminum or stainless steel). An integrated circuit (IC) 62 and an oscillator 63 are provided on a substrate 61. In this case, the IC 62 is an oscillating circuit which controls the frequency applied to the oscillator 63 corresponding to the voltage value input from an external circuit (not shown).

In the oscillator 63, IDT electrodes 65a to 65c are formed on a base 64. The configuration of the oscillator 63 is substantially the same as the configuration of the oscillator shown in FIG. 12. As the base 64, the piezoelectric film laminate according to the invention, such as the piezoelectric film laminate 100 or 200 shown in FIGS. 1A to 1C or FIG. 8, may be used in the same manner as the oscillator shown in FIG. 12.

An interconnect 66 for electrically connecting the IC 62 with the oscillator 63 is patterned on the substrate 61. The IC 62 and the interconnect 66 are connected through a wire 67 such as a gold wire, and the oscillator 63 and the interconnect 66 are connected through a wire 68 such as a gold wire. This allows the IC 62 and the oscillator 63 to be electrically connected through the interconnect 66.

Figure 15:
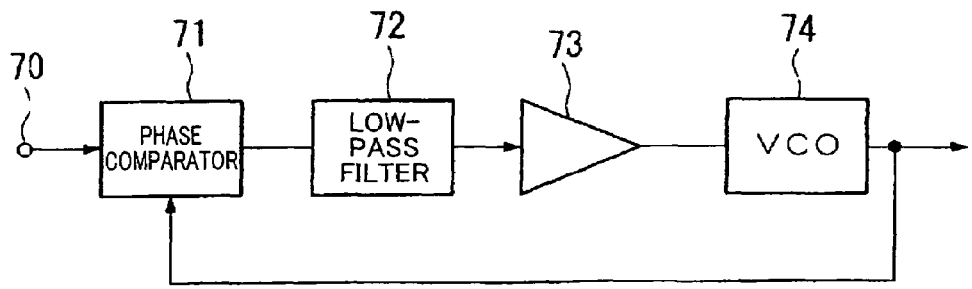
FIG. 15 is a block diagram showing a basic configuration of a PLL circuit.

The VCSO shown in FIGS. 13 and 14 is used as a voltage controlled oscillator (VCO) of a PLL circuit shown in FIG. 15, for example. FIG. 15 is a block diagram showing the basic configuration of the PLL circuit. The PLL circuit includes a phase comparator 71, a low-pass filter 72, an amplifier 73, and a VCO 74. The phase comparator 71 compares the phase (or frequency) of a signal input through an input terminal 70 with the phase (or frequency) of a signal output from the VCO 74, and generates an error voltage signal of which the value is set corresponding to the difference. The low-pass filter 72 allows only a low-frequency component at a position of the error voltage signal output from the phase comparator 71 to pass therethrough. The amplifier 73 amplifies the signal output from the low-pass filter 72. The VCO 74 is an oscillating circuit of which the oscillation frequency continuously changes within a certain range corresponding to the input voltage value.

The PLL circuit having such a configuration operates so that the difference between the phase (or frequency) of the signal input through the input terminal 70 and the phase (or frequency) of the signal output from the VCO 74 is decreased, and synchronizes the frequency of the signal output from the VCO 74 with the frequency of the signal input through the input terminal 70. When the frequency of the signal output from the VCO 74 has been synchronized with the frequency of the signal input through the input terminal 70, the PLL circuit outputs a signal which coincides with the signal input through the input terminal 70 excluding a specific phase difference and follows a change in the input signal.

As described above, the frequency filter and the oscillator according to the sixth embodiment include the surface acoustic wave device according to the invention having a high electromechanical coupling factor. Therefore, according to the sixth embodiment, the size of the frequency filter and the oscillator can be reduced.

7. Seventh Embodiment

7.1. First Example of Seventh Embodiment

Figure 16:
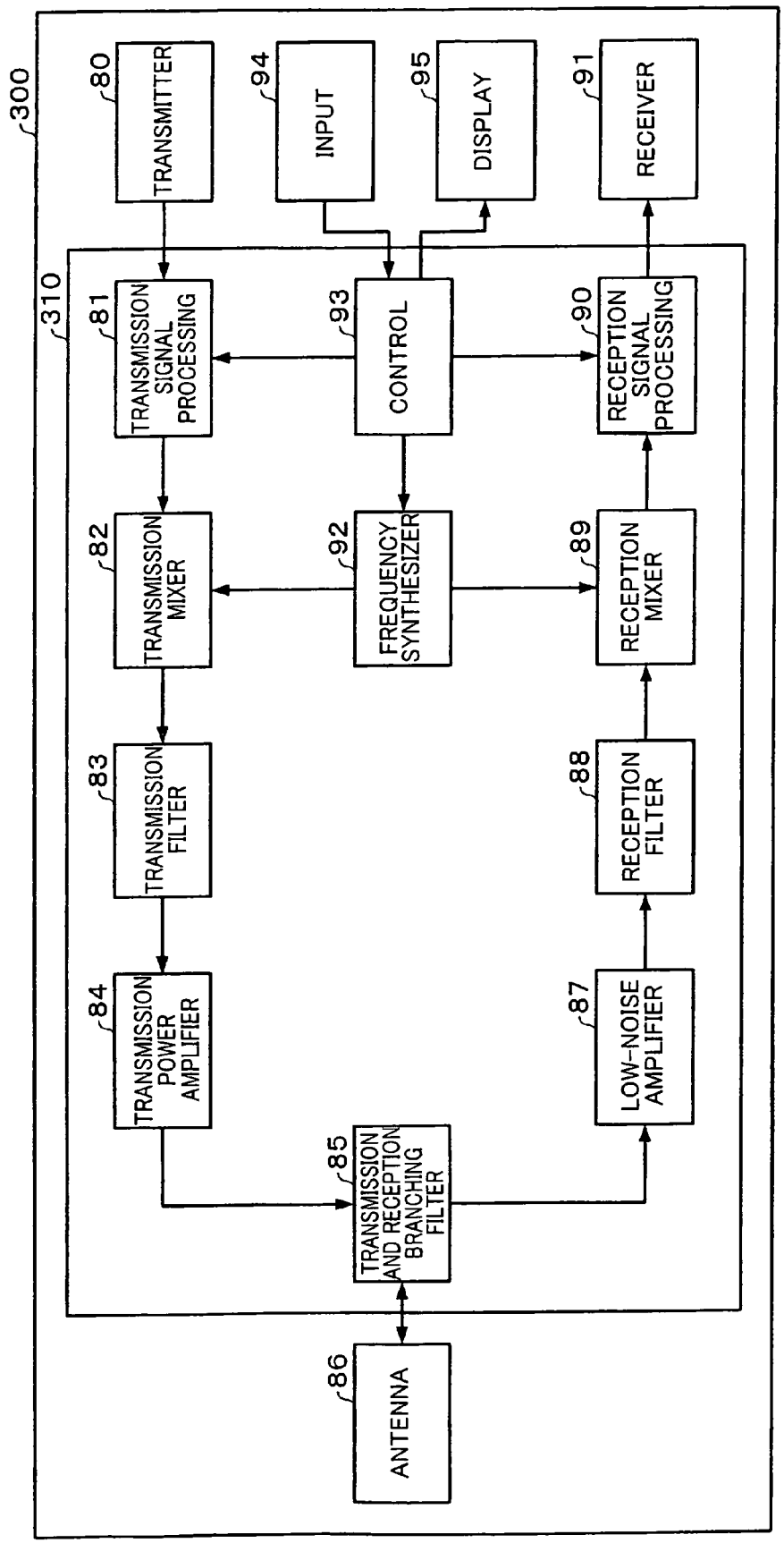
FIG. 16 is a block diagram showing a configuration of an electronic circuit according to the seventh embodiment of the invention.

A first example of an electronic circuit and an electronic instrument according to a seventh embodiment to which the invention is applied is described below with reference to the drawings. FIG. 16 is a block diagram showing the electrical configuration of the electronic instrument according to the seventh embodiment. The electronic instrument is a portable telephone, for example.

An electronic instrument 300 includes an electronic circuit 310, a transmitter 80, a receiver 91, an input section 94, a display section 95, and an antenna section 86. The electronic circuit 310 includes a transmission signal processing circuit 81, a transmission mixer 82, a transmission filter 83, a transmission power amplifier 84, a transmission and reception branching filter 85, a low-noise amplifier 87, a reception filter 88, a reception mixer 89, a reception signal processing circuit 90, a frequency synthesizer 92, and a control circuit 93.

In the electronic circuit 310, the frequency filter shown in FIG. 11 may be used as the transmission filter 83 and the reception filter 88. The frequency to be filtered (frequency allowed to pass) is individually set for the transmission filter 83 and the reception filter 88 corresponding to the necessary frequency of the signal output from the transmission mixer 82 and the frequency necessary for the reception mixer 89. As the VCO 74 of the PLL circuit (see FIG. 15) provided in the frequency synthesizer 92, the oscillator shown in FIG. 12 or the VCSO shown in FIGS. 13 and 14 may be used.

The transmitter 80 is realized by a microphone which converts a sound wave signal into an electric signal, for example. The transmission signal processing circuit 81 is a circuit which performs processing such as D/A conversion or modulation for an electric signal output from the transmitter 80. The transmission mixer 82 mixes the signal output from the transmission signal processing circuit 81 by using the signal output from the frequency synthesizer 92. The transmission filter 83 allows only a signal having a frequency for which an intermediate frequency (hereinafter abbreviated as "IF") is necessary to pass therethrough, and removes a signal having an unnecessary frequency. The signal output from the transmission filter 83 is converted into an RF signal by a conversion circuit (not shown). The transmission power amplifier 84 amplifies electric power of the RF signal output from the transmission filter 83, and outputs it to the transmission and reception branching filter 85.

The transmission and reception branching filter 85 outputs the RF signal output from the transmission power amplifier 84 to the antenna section 86, and transmits the RF signal from the antenna section 86 as radio waves. The transmission and reception branching filter 85 branches a signal received by the antenna section 86, and outputs the resulting signal to the low-noise amplifier 87. The low-noise amplifier 87 amplifies the signal received from the transmission and reception branching filter 85. The signal output from the low-noise amplifier 87 is converted into an IF by a conversion circuit (not shown).

The reception filter 88 allows only a signal having a frequency for which an IF converted by the conversion circuit (not shown) is necessary to pass therethrough, and removes a signal having an necessary frequency. The reception mixer 89 mixes the signal output from the reception filter 88 by using the signal output from the frequency synthesizer 92. The reception signal processing circuit 90 is a circuit which performs processing such as A/D conversion or demodulation for the signal output from the reception mixer 89. The receiver 91 is realized by a small speaker which converts electric signals into sound waves, for example.

The frequency synthesizer 92 is a circuit which generates a signal supplied to the transmission mixer 82 and a signal supplied to the reception mixer 89. The frequency synthesizer 92 includes a PLL circuit, and generates a signal by dividing the frequency of a signal output from the PLL circuit. The control circuit 93 controls the transmission signal processing circuit 81, the reception signal processing circuit 90, the frequency synthesizer 92, the input section 94, and the display section 95. The display section 95 displays the state of the instrument to the user of the portable telephone, for example. The input section 94 allows the user of the portable telephone to input instructions, for example.

7.2. Second Example of Seventh Embodiment

Figure 17:
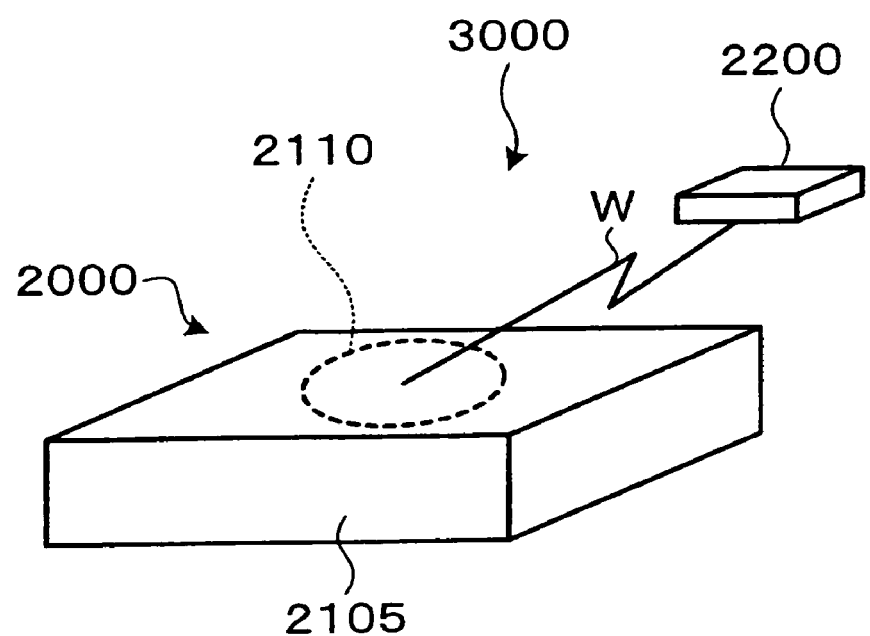
FIG. 17 is a view showing a communication system using a reader/writer according to the seventh embodiment.
Figure 18:
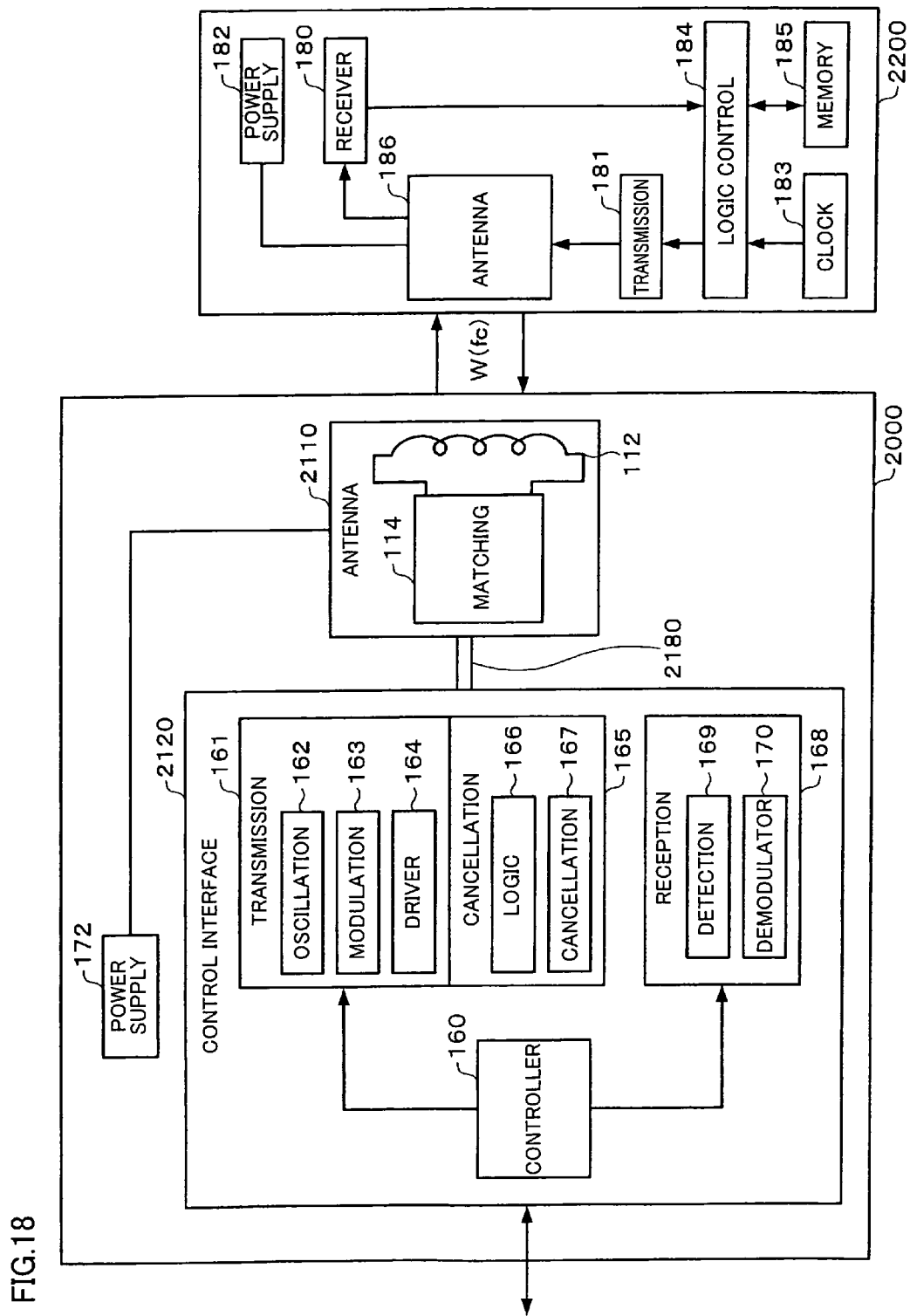
FIG. 18 is a schematic block diagram showing the communication system shown in FIG. 17.

A second example of the electronic circuit and the electronic instrument according to the seventh embodiment to which the invention is applied is described below with reference to the drawings. In the seventh embodiment, a reader/writer 2000 and a communication system 3000 using the reader/writer 2000 are described as an example of the electronic instrument. FIG. 17 is a view showing the communication system 3000 using the reader/writer 2000 according to the seventh embodiment, and FIG. 18 is a schematic block diagram of the communication system 3000 shown in FIG. 17.

As shown in FIG. 17, the communication system 3000 includes the reader/writer 2000 and a contactless information medium 2200. The reader/writer 2000 transmits or receives radio waves W (hereinafter may be called "carrier") having a carrier frequency $f_c$ to or from the contactless information medium 2200, and communicates with the contactless information medium 2200 using wireless communication. The carrier frequency $f_c$ of the radio wave W may be a carrier frequency in an arbitrary frequency band. As shown in FIGS. 17 and 18, the reader/writer 2000 includes a main body 2105, an antenna section 2110 positioned on the upper side of the main body 2105, a control interface section 2120 provided in the main body 2105, and a power supply circuit 172. The antenna section 2110 and the control interface section 2120 are electrically connected through a cable 2180. The reader/writer 2000 is connected with an external host device (e.g. processing device) through the control interface section 2120 (not shown).

The antenna section 2110 has the function of transmitting and receiving information to and from the contactless information medium 2200. As shown in FIG. 17, the antenna section 2110 has a specific communication area (area indicated by the dotted line). The antenna section 2110 includes a loop antenna 112 and a matching circuit 114.

The control interface section 2120 includes a transmission section 161, a damped oscillation cancellation section (hereinafter called "cancellation section") 140, a reception section 168, and a controller 160.

The transmission section 161 modulates data transmitted from an external device (not shown), and transmits the modulated data to the loop antenna 112. The transmission section 161 includes an oscillation circuit 162, a modulation circuit 163, and a driver circuit 164. The oscillation circuit 162 is a circuit for generating a carrier having a specific frequency. The oscillation circuit 162 is generally formed using a quartz oscillator or the like. The communication frequency and the detection sensitivity can be increased by using the oscillator according to the invention. The modulation circuit 163 is a circuit which modulates the carrier according to information provided. The driver circuit 164 receives the modulated carrier and amplifies electric power to drive the antenna section 2110.

The cancellation section 165 has the function of reducing the damped oscillation caused by the loop antenna 112 of the antenna section 2110 along with turning the carrier ON/OFF. The cancellation section 165 includes a logic circuit 166 and a cancellation circuit 167.

The reception section 168 includes a detection section 169 and a demodulator circuit 170. The reception section 168 restores a signal transmitted from the contactless information medium 2200. The detection section 169 detects a change in current which flows through the loop antenna 112, for example. The demodulator circuit 170 is a circuit which demodulates the change detected by the detection section 169.

The controller 160 acquires information from the demodulated signal and transfers the information to the external device. The power supply circuit 172 receives power from the outside, arbitrarily performs voltage conversion, and supplies necessary power to each circuit. A built-in cell may be used as the power supply.

The contactless information medium 2200 communicates with the reader/writer 2000 using electromagnetic waves (radio waves). As examples of the contactless information medium 2200, a contactless IC tag, a contactless IC card, and the like can be given.

The operation of the communication system 3000 using the reader/writer 2000 according to the seventh embodiment is described below. When data is transferred to the contactless information medium 2200 from the reader/writer 2000, data from the external device (not shown) is processed by the controller 160 of the reader/writer 2000, and transmitted to the transmission section 161. In the transmission section 161, a high-frequency signal having a specific amplitude is supplied as the carrier from the oscillation circuit 162. The carrier is modulated by the modulation circuit 163 so that the modulated high-frequency signal is output. The modulated high-frequency signal output from the modulation circuit 163 is supplied to the antenna section 2110 through the driver circuit 164. The cancellation section 165 generates a specific pulse signal in synchronization with the OFF timing of the modulated high-frequency signal to contribute to a reduction in the damped oscillation in the loop antenna 112.

In the contactless information medium 2200, the modulated high-frequency signal is supplied to the receiver circuit 180 through the antenna section 186. The modulated high-frequency signal is also supplied to the power supply circuit 182 so that a specific power supply voltage necessary for each section of the contactless information medium 2200 is generated. The data output from the receiver circuit 180 is demodulated and supplied to the logic control circuit 184. The logic control circuit 184 operates based on the output from a clock 183. The logic control circuit 184 processes the supplied data and writes specific data into a memory 185.

When data is transferred to the reader/writer 2000 from the contactless information medium 2200, an unmodulated high-frequency signal having a specific amplitude is output from the modulation circuit 163 of the reader/writer 2000. The high-frequency signal is transferred to the contactless information medium 2200 through the driver circuit 164 and the loop antenna 112 of the antenna section 2110.

In the contactless information medium 2200, the data read from the memory 185 is processed by the logic control circuit 184 and supplied to the transmission circuit 181. In the transmission circuit 181, the switch is turned ON/OFF depending on the "1" or "0" bit of the data.

In the reader/writer 2000, the load of the loop antenna 112 of the antenna section 2110 changes when the switch of the transmission circuit 181 is turned ON/OFF. Therefore, the amplitude of the high frequency current which flows through the loop antenna 112 changes. Specifically, the amplitude of the high frequency current is modulated by the data supplied from the contactless information medium 2200. The high frequency current is detected by the detection section 169 of the reception section 168 and demodulated by the demodulator circuit 170 to obtain data. The data is processed by the controller 160 and transmitted to the external device or the like.

7.3. Third Example of Seventh Embodiment

The electronic circuit and the electronic instrument according to the seventh embodiment include the surface acoustic wave device according to the invention having a high electromechanical coupling factor. Therefore, according to the seventh embodiment, power consumption of the electronic circuit and the electronic instrument can be reduced.

Although only some embodiments of the invention have been described in detail above, those skilled in the art will readily appreciate that many modifications are possible in the embodiments without departing from the novel teachings and advantages of this invention. Accordingly, all such modifications are intended to be included within the scope of this invention.

For example, the frequency filter and the oscillator according to the invention may be respectively applied to a broadband filter and a VCO in a UWB system, portable telephone, wireless LAN, and the like.

In the above-described embodiment, the communication system using the portable telephone and the reader/writer is described as an example of the electronic instrument, and the electronic circuit provided in the portable telephone and the reader/writer is described as an example of the electronic circuit. However, the invention is not limited thereto. The invention may be applied to various mobile communication instruments and electronic circuits provided therein. For example, the invention may also be applied to communication instruments used in a stationary state such as a tuner which receives broadcast satellite (BS) broadcasts and electronic circuits provided therein, and electronic instruments such as a HUB using an optical signal propagated through an optical cable and electronic circuits provided therein.

What is claimed is:

1. A method of manufacturing a piezoelectric film laminate, comprising:
   providing a sapphire substrate;
   providing a precursor composition including a precursor for forming a lead zirconate titanate niobate film, the precursor including at least lead, niobium, titanium, and zirconium and having a partial ester bond;
   applying the precursor composition to the sapphire substrate and heating the applied precursor composition to form a lead zirconate titanate niobate film; and
   forming a potassium niobate film on the lead zirconate titanate niobate film.

2. The method of manufacturing a piezoelectric film laminate as defined in claim 1, wherein the precursor is dissolved or dispersed in an organic solvent.

3. The method of manufacturing a piezoelectric film laminate as defined in claim 2, wherein the organic solvent is an alcohol.

4. The method of manufacturing a piezoelectric film laminate as defined in claim 1,
   wherein the precursor composition is obtained by mixing a sol-gel raw material including a hydrolysis-condensation product of a metal alkoxide of at least niobium, titanium, and zirconium, a polycarboxylic acid or a polycarboxylic acid ester, and an organic solvent; and
   wherein the precursor composition includes the precursor having an ester bond resulting from esterification of the polycarboxylic acid or a polycarboxylic acid derived from the polycarboxylic acid ester and the metal alkoxide.

5. The method of manufacturing a piezoelectric film laminate as defined in claim 4, wherein the polycarboxylic acid or the polycarboxylic acid ester is a dicarboxylic acid or a dicarboxylic acid ester.

6. The method of manufacturing a piezoelectric film laminate as defined in claim 5, wherein the dicarboxylic acid ester is at least one ester selected from a succinic acid ester, a maleic acid ester, and a malonic acid ester.

7. The method of manufacturing a piezoelectric film laminate as defined in claim 4, wherein the sol-gel raw material further includes a metal carboxylate.

8. The method of manufacturing a piezoelectric film laminate as defined in claim 7, wherein the metal carboxylate is a lead carboxylate.

* * * * *